(12) United States Patent
Chiruvolu et al.

(10) Patent No.: US 8,119,233 B2
(45) Date of Patent: Feb. 21, 2012

(54) FUNCTIONAL COMPOSITES, FUNCTIONAL INKS AND APPLICATIONS THEREOF

(75) Inventors: Shivkumar Chiruvolu, San Jose, CA (US); Vladimir K. Dioumaev, Mountain View, CA (US); Nobuyuki Kambe, Menlo Park, CA (US); Hui Du, Sunnyvale, CA (US)

(73) Assignee: NanoGram Corporation, Milpitas, CA (US)

( * ) Notice: Subject to any disclaimer, the term of this patent is extended or adjusted under 35 U.S.C. 154(b) by 755 days.

(21) Appl. No.: 12/070,063

(22) Filed: Feb. 14, 2008

(65) Prior Publication Data

US 2008/0199687 A1    Aug. 21, 2008

Related U.S. Application Data

(60) Provisional application No. 60/901,786, filed on Feb. 17, 2007.

(51) Int. Cl.
*C08K 3/02* (2006.01)
*C08K 3/08* (2006.01)

(52) U.S. Cl. ........ 428/331; 428/323; 524/442; 524/476; 524/570

(58) Field of Classification Search .............. 428/331, 428/323; 524/442, 476, 570
See application file for complete search history.

(56) References Cited

U.S. PATENT DOCUMENTS

| | | | |
|---|---|---|---|
| 4,061,503 A | 12/1977 | Berger et al. |
| 4,151,154 A | 4/1979 | Berger |
| 4,680,204 A | 7/1987 | Das et al. |
| 4,828,695 A | 5/1989 | Yamamura et al. |
| 4,842,832 A | 6/1989 | Inoue et al. |
| 4,844,578 A | 7/1989 | Pierini et al. |
| 4,927,464 A | 5/1990 | Cowie |
| 4,955,692 A | 9/1990 | Merlin et al. |
| 4,972,008 A | 11/1990 | Lee et al. |
| 5,049,371 A | 9/1991 | Rinn et al. |
| 5,068,056 A | 11/1991 | Robb |
| 5,075,206 A | 12/1991 | Noda et al. |
| 5,108,201 A | 4/1992 | Matsuura et al. |
| 5,130,362 A | 7/1992 | Prasad et al. |
| 5,270,076 A | 12/1993 | Evers |
| 5,314,947 A | 5/1994 | Sawaragi |
| 5,322,888 A | 6/1994 | Kato et al. |
| 5,372,749 A | 12/1994 | Li et al. |
| 5,443,811 A | 8/1995 | Karvinen |
| 5,447,708 A | 9/1995 | Helble et al. |
| 5,470,910 A | 11/1995 | Spanhel |
| 5,494,949 A | 2/1996 | Kinkel et al. |
| 5,497,445 A | 3/1996 | Imoto |
| 5,565,041 A | 10/1996 | Hiraoka et al. |
| 5,623,011 A | 4/1997 | Bernard |
| 5,654,090 A | 8/1997 | Kayanoki |
| 5,683,501 A | 11/1997 | Tomihisa et al. |
| 5,698,309 A | 12/1997 | Dallmann et al. |
| 5,777,433 A | 7/1998 | Lester et al. |
| 5,789,326 A | 8/1998 | Hansen et al. |
| 5,807,364 A | 9/1998 | Hansen |
| 5,837,804 A | 11/1998 | Yamagishi et al. |
| 5,840,111 A | 11/1998 | Wiederhoft et al. |
| 5,850,498 A | 12/1998 | Shacklette et al. |
| 5,853,809 A | 12/1998 | Campbell et al. |
| 5,857,039 A | 1/1999 | Bosc et al. |
| 5,902,569 A | 5/1999 | Oshima et al. |
| 5,935,890 A | 8/1999 | McLaughlin et al. |
| 5,952,125 A | 9/1999 | Bi et al. |
| 5,958,348 A | 9/1999 | Bi et al. |
| 5,965,299 A | 10/1999 | Khan et al. |
| 5,968,652 A | 10/1999 | Hanggi et al. |
| 5,989,111 A | 11/1999 | Lamphere et al. |
| 5,989,514 A | 11/1999 | Bi et al. |
| 5,990,024 A | 11/1999 | Blum et al. |
| 5,997,795 A | 12/1999 | Danforth et al. |
| 6,001,326 A | 12/1999 | Kim et al. |
| 6,002,522 A | 12/1999 | Todori et al. |
| 6,005,707 A | 12/1999 | Berggren et al. |
| 6,026,209 A | 2/2000 | Rhee et al. |
| 6,049,090 A | 4/2000 | Clark, Jr. |

(Continued)

FOREIGN PATENT DOCUMENTS

WO       96/28137 A1    9/1996

(Continued)

OTHER PUBLICATIONS

Encyclopedia of Polymer Science and Engineering, vol. 4, Wiley-Interscience, Edited by Mark et al., pp. 288-289, 1986.
Shimoda et al., "Solution-processed silicon films and trasnistors", Nature Letters, 440:783-786 (Apr. 6, 2006).
Watanabe et al, "Polymeric arrayed-waveguide grating multiplexer with wide tuning range," Electronics Letters, 33 (18):1547-1548 (Aug. 28, 1997).
Yang et al, "Hierarchically Ordered Oxides," Science, 282:2244-2246 (Dec. 18, 1998).
Zimmerman et al., "High refractive index films of polymer nanocomposite," J. Mater. Res., 8(7):1742-1748 (Jul. 1993).

(Continued)

*Primary Examiner* — Robert D. Harlan
(74) *Attorney, Agent, or Firm* — Dardi & Herbert, PLLC; Peter S. Dardi

(57) ABSTRACT

Functional composite materials comprise elemental inorganic particles within an organic matrix. The elemental inorganic materials generally comprise elemental metal, elemental metalloid, alloys thereof, or mixtures thereof. In alternative or additional embodiments, the inorganic particles can comprise a metal oxide, a metalloid oxide, a combination thereof or a mixture thereof. The inorganic particles can have an average primary particle size of no more than abut 250 nm and a secondary particle size in a dispersion when blended with the organic matrix of no more than about 2 microns. The particles can be substantially unagglomerated within the composite. The organic binder can be a functional polymer such as a semiconducting polymer. The inorganic particles can be surface modified, such as with a moiety having an aromatic functional group for desirable interactions with a semiconducting polymer. Appropriate solution based methods can be used for forming the composite from dispersions of the particles. The composites can be processed into products, such as printed electronics devices.

18 Claims, 15 Drawing Sheets

U.S. PATENT DOCUMENTS

| | | | |
|---|---|---|---|
| 6,080,337 | A | 6/2000 | Kambe et al. |
| 6,088,492 | A | 7/2000 | Kaneko et al. |
| 6,091,537 | A | 7/2000 | Sun et al. |
| 6,091,879 | A | 7/2000 | Chan et al. |
| 6,106,798 | A | 8/2000 | Kambe et al. |
| 6,107,364 | A | 8/2000 | Fong et al. |
| 6,136,287 | A | 10/2000 | Horne et al. |
| 6,136,891 | A | 10/2000 | Chopin et al. |
| 6,136,905 | A | 10/2000 | Suzuki et al. |
| 6,139,626 | A | 10/2000 | Norris et al. |
| 6,144,795 | A | 11/2000 | Dawes et al. |
| 6,193,936 | B1 | 2/2001 | Gardner et al. |
| 6,200,674 | B1 | 3/2001 | Kumar et al. |
| 6,211,931 | B1 | 4/2001 | Fukao et al. |
| 6,225,007 | B1 | 5/2001 | Horne et al. |
| 6,229,949 | B1 | 5/2001 | Ido et al. |
| 6,236,774 | B1 | 5/2001 | Lackritz et al. |
| 6,261,469 | B1 | 7/2001 | Zakhidov et al. |
| 6,282,335 | B1 | 8/2001 | Losch et al. |
| 6,311,004 | B1 | 10/2001 | Kenney et al. |
| 6,329,058 | B1 | 12/2001 | Arney et al. |
| 6,339,030 | B1 | 1/2002 | Constant et al. |
| 6,387,531 | B1 | 5/2002 | Bi et al. |
| 6,391,494 | B2 | 5/2002 | Reitz et al. |
| 6,407,156 | B1 | 6/2002 | Hagihara et al. |
| 6,432,526 | B1 | 8/2002 | Arney et al. |
| 6,433,931 | B1 | 8/2002 | Fink et al. |
| 6,442,321 | B1 | 8/2002 | Berini |
| 6,482,374 | B1 | 11/2002 | Kumar et al. |
| 6,506,493 | B1 | 1/2003 | Kumar et al. |
| 6,593,417 | B1 | 7/2003 | Anderson et al. |
| 6,599,631 | B2 | 7/2003 | Kambe et al. |
| 6,607,706 | B1 | 8/2003 | Kumar et al. |
| 6,692,660 | B2 | 2/2004 | Kumar |
| 6,706,795 | B1 | 3/2004 | Garti et al. |
| 6,726,990 | B1 | 4/2004 | Kumar et al. |
| 6,849,334 | B2 | 2/2005 | Horne et al. |
| 6,921,576 | B2 | 7/2005 | Terauchi et al. |
| 6,921,788 | B1 | 7/2005 | Izawa et al. |
| 6,952,504 | B2 | 10/2005 | Bi et al. |
| 7,057,206 | B2 | 6/2006 | Halik et al. |
| 7,226,966 | B2 | 6/2007 | Kambe et al. |
| 2002/0192137 | A1 | 12/2002 | Chaloner-Gill et al. |
| 2002/0192476 | A1 | 12/2002 | Kambe et al. |
| 2003/0045632 | A1 | 3/2003 | Shiho et al. |
| 2003/0059540 | A1* | 3/2003 | Berni et al. ............... 427/376.1 |
| 2003/0096102 | A1 | 5/2003 | Yoshihara et al. |
| 2003/0203205 | A1 | 10/2003 | Bi et al. |
| 2004/0046501 | A1 | 3/2004 | Hayashi |
| 2004/0173780 | A1 | 9/2004 | Kumar |
| 2005/0003220 | A1 | 1/2005 | Kitahara et al. |
| 2005/0170192 | A1 | 8/2005 | Kambe et al. |
| 2006/0189113 | A1 | 8/2006 | Vanheusden et al. |
| 2007/0003694 | A1 | 1/2007 | Chiruvolu et al. |
| 2007/0284570 | A1 | 12/2007 | Sydorenko et al. |
| 2008/0150184 | A1 | 6/2008 | Chiruvolu et al. |
| 2008/0160265 | A1 | 7/2008 | Hieslmair et al. |
| 2008/0202576 | A1 | 8/2008 | Hieslmair |

FOREIGN PATENT DOCUMENTS

| | | | |
|---|---|---|---|
| WO | 98/35248 | A1 | 8/1998 |
| WO | 00/04593 | A1 | 1/2000 |
| WO | 01/32799 | A1 | 5/2001 |
| WO | WO 01/32799 | A1 * | 5/2001 |
| WO | 01/81079 | A1 | 11/2001 |

* cited by examiner ical particles can comprise a metal oxide, a metalloid oxide, combinations thereof or mixtures thereof. In general, the composites can be formed from a dispersion of the inorganic particles in a solvent to which the binder is added, or the binder can be dissolved in the solvent. If the inorganic particles have a low degree of agglomeration with correspondingly small secondary particle sizes, the composites can similarly comprise particles with low degrees of agglomeration. As noted herein, in some embodiments, very small secondary particle sizes can be achieved.

FUNCTIONAL COMPOSITES, FUNCTIONAL INKS AND APPLICATIONS THEREOF

CROSS REFERENCE TO RELATED APPLICATIONS

This application claims priority to copending provisional patent application Ser. No. 60/901,786 filed on Feb. 17, 2007 to Dioumaev et al., entitled "Functional Inks and Applications Thereof," incorporated herein by reference.

FIELD OF THE INVENTION

The invention relates to composites of submicron particles and organic binders. More particularly, the composites can comprise functional submicron particles that can be, for example, conductors, semiconductors or otherwise functional. The invention further relates to inks that can be used to deposit the composites and to applications of the composites, such as for printable electronics.

BACKGROUND OF THE INVENTION

Production of a wide variety of modern products imposes ever growing pressures for materials with a range of properties. The shrinking of devices to impose growing performance in small volumes imposes additional challenges. However, cost constraints balance the need for greater performance. Thus, the availability of a corresponding range of processing abilities is useful for the selection of an appropriate process for particular performance requirements at a desired cost.

SUMMARY OF THE INVENTION

In a first aspect, the invention pertains to a composite material comprising inorganic particles and an organic binder in which the particles have an average primary particle size of no more than about 250 nm and a dispersed secondary particle size of no more than about 2 microns when incorporated into the composite. The inorganic particles comprise an elemental metal, an elemental metalloid, alloy thereof or combination thereof.

In a further aspect, the invention pertains to a composite material comprising inorganic particles and an organic semiconductor binder. The particles can have an average primary particle size of no more than about 250 nm and a dispersed secondary particle size of no more than about 2 microns when incorporated into the composite. In some embodiments, the inorganic particles comprise a metal oxide, a metalloid oxide, combination thereof or mixtures thereof. The particles within the composite are substantially non-agglomerated.

Furthermore, the invention pertains to a method for forming a composite of inorganic particles and an organic binder in which the particles have an average primary particle size of no more than about 250 nm. The method comprises combining a liquid dispersion of silicon particles and the organic binder to form a composite dispersion wherein the particles have an average secondary particle size of no more than about 2 microns in the composite dispersion. The inorganic particles comprise elemental metal, elemental metalloid, alloy thereof or combination thereof.

In another aspect, the invention pertains to a collection of silicon nanoparticles having substantial crystallinity, an H atom content of between 0.01 atomic percent and 5 atomic percent, and an average particle size less than 500 nanometers.

DETAILED DESCRIPTION OF THE INVENTION

Figure 1:
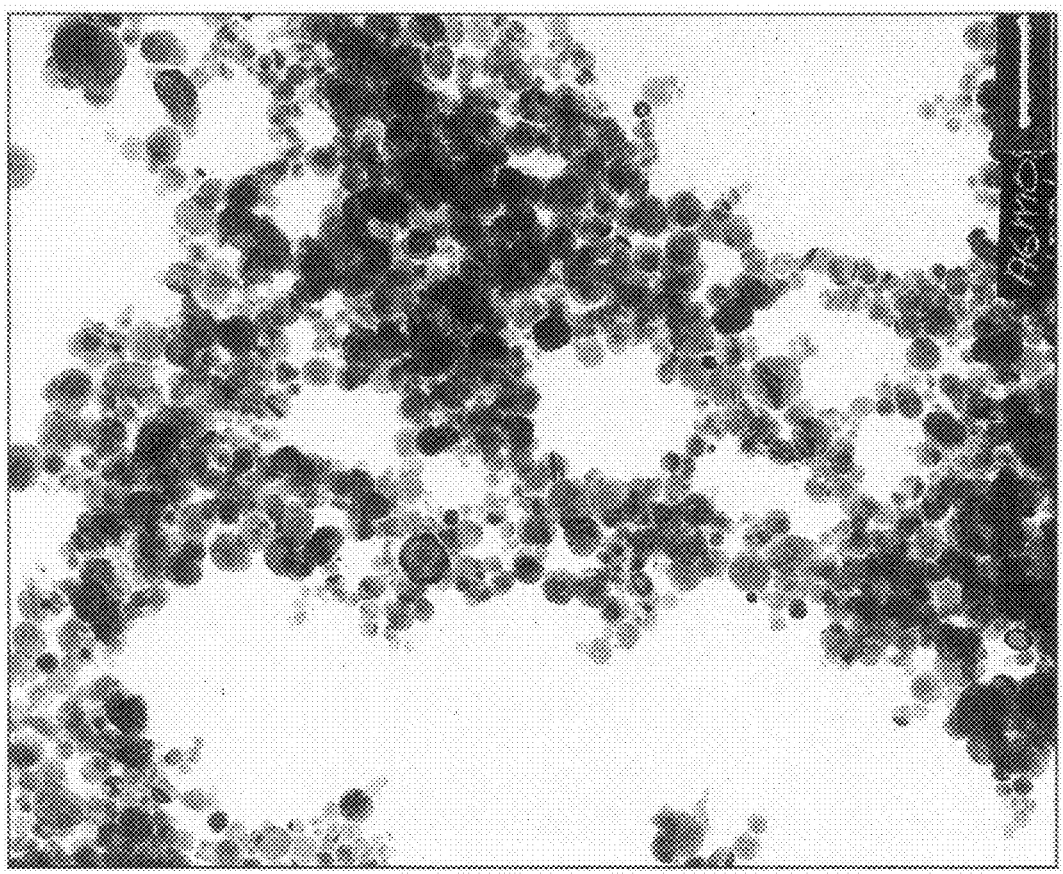
FIG. 1 is a photomicrograph of a first sample of elemental silver nanoparticles.

Desirable composite materials comprise submicron inorganic particles of an elemental metal or metalloid, along with a binder matrix, such as an organic semiconducting composition in which the particles are well dispersed within the matrix. In alternative or additional embodiments, the submicron inorganic particles comprise a metal oxide, a metalloid oxide, a combination thereof or a mixture thereof in a semiconducting organic matrix. In some embodiments, the composite materials can be deposited using functional inks that incorporate highly uniform inorganic particles with a matrix material within a deliverable liquid ink suitable for forming the composites with high particle loadings. In general, the matrix material binding the inorganic submicron particles can be an organic binder, such as organic semiconducting polymers. The highly uniform inorganic particles can be doped particles, such as doped crystalline silicon particles, although other doped or undoped elemental inorganic particles can be used to introduce desired functionalities. The submicron inorganic particles can be surface modified with moieties that stabilize the interactions with the polymer and/or to stabilize liquid dispersions of the particles used to form the composite. In particular, the particles can be surface modified with aromatic moieties that can stably interact with semiconducting compositions. The composites can have high particle loadings of substantially unagglomerated particles. The composites can be effectively used for printed electronics applications and other suitable applications.

Suitable functional inks can comprise dispersions of the inorganic particles, such as elemental inorganic particles, along with an organic binder. The inks can then be delivered to form desired structures for a particular application. Suitable printing approaches include, for example, inkjet printing, which can efficiently and rapidly deposit functional inks at moderate resolution, although other printing processes can be used to achieve appropriate levels of printing resolution with corresponding adjustments of ink properties as well as other deposition processes that can be used to form desirable structures. An integrated process can be used to prepare, print and cure a substrate with functional inks to form structures and devices along a substrate.

The composites generally comprise inorganic particles dispersed within a polymer matrix. In embodiments of particular interest, the particles are well dispersed such that there is no substantial agglomeration. Furthermore, the composite can have a high loading of particles. For highly loaded composites, the functional properties of the well dispersed particles can have a substantial influence on the properties of the composite. Correspondingly, the polymer properties can be selected based on functional considerations as well as processing considerations and other practical factors.

In some embodiments, the inorganic particles of particular interest generally comprise an elemental metalloid, elemental metal, alloys thereof, doped forms thereof or mixtures thereof. Elemental elements refer to unionized, i.e., $M^O$, form of the elements, which are solids for the metal and metalloid elements, although these particles can comprise small amounts of impurities, such as oxygen, carbon, hydrogen and the like. In general, the elemental particles comprise non-metal-metalloid elements at concentrations of no more than about 20 atomic percent, in some embodiments no more than about 15 atomic percent and in further embodiments form about 0.01 to about 5 atomic percent. Metalloid elements include elements with intermediate properties between metals and non-metals. In alternative or additional embodiments, the particles comprise a metal oxide, a metalloid oxide, combinations thereof or a mixture thereof, which may or may not be doped.

In general, the inorganic particles can be selected to introduce desired functionality for the composite material. Thus, the elemental inorganic particles can be, for example, electrical conductors, inductors, semiconductors or the like. Suitable electrical conductors include, for example, elemental metal particles such as silver, nickel, iron, copper, cobalt, platinum, alloys thereof or mixtures thereof. Suitable inducting compositions include, for example, iron alloys, such as Fe—Ni. Semiconducting materials include, for example, elemental metalloids, such as silicon (Si), elemental germanium (Ge), alloys, such as gallium arsenide, silicon germanium, and aluminum gallium arsenide, doped compositions thereof and the like. Metal/metalloid oxide particles can be dielectrics or semiconductors.

The inorganic particles generally have an average primary particle diameter of no more than a micron and in some embodiments no more than about 250 nanometers (nm). The particles also can have a high degree of uniformity with respect to primary particle size. Secondary particle size refers to measurements of particle size within a dispersion. In some embodiments, the particles can have small average secondary particle sizes. In particular, the average secondary particle size can be no more than two microns and in further embodiments no more than about a micron. A relatively small secondary particle size based on the primary particle size generally is indicative that the primary particles are not substantially fused.

With respect to functional composite formation, it is desirable for the particles to have a uniform primary particle size and for the primary particles to be substantially unfused. The formation of a good dispersion with a small secondary particle size and a narrow secondary particle size distribution can be facilitated through the matching of the surface chemistry of the particles with the properties of the dispersing liquid. The surface chemistry of particles can be influenced during synthesis of the particles as well as following collection of the particles. For example, the formation of dispersions with polar solvents is facilitated if the particles have polar groups on the particle surface.

In some embodiments, the elemental inorganic particles can become surface oxidized, for example through exposure to air. For these embodiments, the surface can have bridging oxygen atoms in M-O-M structures or M-O—H groups if hydrogen is available during the oxidation process, where M represents a metal/metalloid atom. The presence of OH bonds provide for alternative surface modification approaches. In further embodiments, the surface of the particles can have M-H groups that provide for a particular surface chemistry and can be used for particular surface coupling chemistry, as described further below.

The inorganic particles can generally be synthesized through any appropriate process. The ability to form good dispersion is related to the ability to synthesize inorganic particles, including, for example, doped inorganic particles, with appropriate particle properties relating to the particle size, uniformity and surface chemistry. Flow based synthesis methods have been discovered to be very versatile with respect to synthesizing desired elemental particles with or without dopants. In flow based methods, such as laser pyrolysis and flame pyrolysis, the product particles are collected as a powder. These flow-based approaches are particularly versatile with respect to forming doped inorganic particles.

Laser pyrolysis is a convenient and versatile approach for the synthesis of highly uniform submicron inorganic particles with a range of selectable stoichiometric compositions as well as with selectable dopants. Laser pyrolysis has proven to be an effective approach for the introduction of a range of dopants into submicron inorganic particles and nanoparticles. In the laser pyrolysis process, the dopants are introduced through the introduction of suitable elements into the reactant stream such that the elements can be incorporated into the product particles.

The dopant elements can be delivered into the reactant stream as a suitable composition at an appropriate composition to form the desired doped product particles. The introduction of dopants into amorphous particles, such as silica, germania and the like, is described further in U.S. Pat. No. 6,849,334 to Horne et al, entitled "Optical Materials and Optical Devices," incorporated herein by reference, referred to herein as the '334 patent. The introduction of dopants into crystalline nanoparticles with a range of metal/metalloid compositions is described further in U.S. Pat. No. 6,692,660 to Kumar, entitled "High Luminescence Phosphor Particles and Related Particle Compositions," incorporated herein by reference.

The organic binder material, such as a polymer, functions to support the elemental inorganic particles in a dispersed configuration through the polymer matrix. In general a range of organic binders, such as polymers and non-polymer organic semiconducting compositions, are suitable for the formation of the inks and ultimate composites. However, it can be desirable for the organic binders to contribute to the functional properties of the composite, such as the electrical properties of the composite. Thus, in some embodiments, the matrix material comprises a semiconducting composition, which can contribute to the electrical properties of the composite in an effective way.

Solution-based methods are generally desirable for the formation of the composites. Thus, a dispersion generally is formed comprising the organic binder and the inorganic particles. This dispersion can be delivered as an ink for the formation of desired structures and devices. The functional inks of interests described herein comprise dispersed elemental inorganic submicron particles, an organic matrix material and a liquid. Additional additives can be used if these additives can be removed without contaminating the resulting structure or if the additive within the composite does not have a detrimental effect on function. In general, the ink/dispersion can be delivered through coating methods or using printing techniques, which can be suitable for forming selected patterns for device formation. While in some embodiments, the composite dispersions can be directly formed through the addition of the components to the liquid, generally it is desirable to first separately form an inorganic particle dispersion and an organic binder solution.

The use of inks for providing doped or undoped semiconductor particles is described further in U.S. patent application Ser. No. 12/006,453 to Hieslmair et al., entitled "SILICON/GERMANIUM PARTICLE INKS, DOPED PARTICLES, PRINTING AND PROCESSES FOR SEMICONDUCTOR APPLICATIONS," incorporated herein by reference. This application describes dispersions of highly doped Si, Ge, combinations thereof or mixtures thereof dispersed in a suitable liquid. Similarly, inks formed with doped silica and germania are described further in copending U.S. patent application Ser. No. 12/006,459 to Hieslmair et al., entitled "Silicon/Germanium Oxide Particle Inks, Inkjet Printing and Processes for Doping Semiconductor Substrates," incorporated herein by reference. In contrast with the functional inks described in the above applications, the inks in the copending applications do not provide a matrix for the resulting material. Thus, these other inks are used as a vehicle to deliver the semiconducting particles that can be fused or otherwise processed in to desired material, which may generally involve higher temperature processing than the approaches described herein based on organic matrices.

In general, the surface chemistry of the inorganic particles influences the process of forming a dispersion of the particles. In particular, it is easier to disperse the inorganic particles to form smaller secondary particle sizes if the dispersing liquid and the particle surfaces are compatible chemically, although other parameters such as density, particle surface charge, solvent molecular structure and the like also directly influence dispersability. In some embodiments, the liquid may be selected to be appropriate for the particular use of the dispersion, such as for a printing process. The surface properties of the particles can be correspondingly be adjusted for the dispersion. For embodiments directed to silicon synthesized using silanes, the resulting silicon generally can be partially hydrogenated, i.e., the silicon includes some small amount of hydrogen in the material. It is generally unclear if this hydrogen or a portion of the hydrogen is at the surface as Si—H bonds. However, the presence of a small amount of hydrogen does not presently seem particularly significant.

In general, the surface chemistry of the particles can be influenced by the synthesis approach, as well as subsequent handling of the particles. The surface by its nature represents a termination of the underlying solid state structure of the particle. This termination of the surface of the elemental inorganic particles can involve truncation of the corresponding particle lattice. The termination of particular particles influences the surface chemistry of the particles.

While in general any reasonable approach can be used to synthesize the particles, flow based methods can be particularly effective at forming uniform particles. Flow based methods generally involve the formation of a dry powder that is subsequently dispersed. As described herein, suitable approaches have been found to disperse dry nanoparticle powders, if desired, perform surface modification of the particles in a dispersion and form inks and the like for deposition. Using the processing approaches described herein, inks can be formed that can be deposited using inkjet printing and other convenient printing approaches. Thus, the advantages of vapor-based particle synthesis can be combined with desirable solution based processing approaches with highly dispersed particles to obtain desirable dispersions and inks.

The surface properties of the inorganic particles influence the processability of the particles. The synthesis approach influences the surface chemistry of the particles. It has been found that the formation of good particle dispersions with low level of agglomeration can significantly influence the properties of composite materials formed with the dispersed particles. In particular, good particle dispersions and corresponding appropriate blending techniques can result in highly uniform composite materials. The highly uniform composites then have properties of a uniform material with the overall properties contributed by the components of the composite.

Surface modification compositions can be interacted with the particles to introduce desired surface properties. The surface modification compositions may or may not chemically bond with the surface of the inorganic particle. If the surface modification composition does not chemically bond with the inorganic particle surface, the composition generally functions as a surface active agent relative to the particle surface so that the there is some specific association of the composition with the particle surface. The surface modification composition generally has one or more functional groups that interact with the inorganic particle and one or more side groups that are available to interact with the surrounding environment, such as a polymer matrix and/or a dispersing liquid. The side groups of the surface modifying agent can stabilize interactions with a liquid and/or a polymer matrix. For example, aromatic side groups can be effective to facilitate good dispersion of particles within some semiconducting organic polymer due to the aromatic nature of the polymers. The respective aromatic rings can form more stable blends than other general types of interactions.

Generally, the surface modification can be used to stabilize dispersions of the surface modified particles in an appropriate dispersing liquid. However, the liquid used for composite formation may not be a compatible liquid for the inorganic particles. Therefore, the selection of liquid for various processing steps can involve a balance of various issues, as discussed further below.

In general, it is desirable to have a good dispersion of inorganic particles so that the resulting ultimate material has a more uniform composition. Based on experiences with optical inorganic particle-polymer composites, it is expected that a more uniform inorganic particle—matrix composite can be formed if the inorganic particles are uniformly dispersed prior to combining the particles with the matrix composition, such as a semiconducting polymer. The organic matrix composition can be similarly blended with a solvent as desired. The formation of optical composites comprising inorganic particles with polymers is described in copending U.S. patent application Ser. No. 11/645,084 filed on Dec. 22, 2006, entitled "Composites of Polymer and Metal/Metalloid Inorganic Nanoparticles and Method for Forming These Composites," incorporated herein by reference.

In general, the particle dispersion can comprise a dispersant that is miscible with the solvent for the organic binder so that the resulting blend can achieve desired levels of blending. The particle dispersion can be added gradually to the organic matrix solution with vigorous mixing. In this way the inorganic particles can be well dispersed in the resulting composite ink. Excess solvent can be removed and optionally recycled to form the functional ink with the desired properties, such as viscosity and concentration.

With respect to forming structures from composites, any reasonable printing or coating process can be used to deposit the functional inks. Similarly, the substrate can be selected based on the particular application. Printing approaches are particularly convenient for the formation of flexible circuits.

The properties of the inks, such as viscosity, can be adjusted for the specific printing process, such as by adjusting the amount of solvent, and/or by changing the properties of the organic polymer, such as molecular weight. Suitable printing approaches for the functional inks include, for example, inkjet printing, lithographic printing, gravure printing, screen printing and the like. Through the selection of the appropriate printing process a selected resolution can be achieved. Inkjet printing can be desirable for moderate to high resolution applications due to its high speed and reduction of printing steps, which can save costs. In particular, masking is not needed for inkjet printing.

In general, the substrate can be prepared for the printing process if appropriate. Such preparation can involve patterning, deposition of an insulating layer, cleaning or other processing. Once the substrate is prepared, it can be printed using the selected printing process. Once the ink has been printed, it can be cured to fix the ink. Curing can comprise for example, drying the ink, applying heat, applying radiation or combinations thereof. In some embodiments, an organic polymer is crosslinked during the curing process.

The functional inks and corresponding coating and printing processes can be used in the fabrication of any reasonable circuit or other functional structures. Some applications can comprise a plurality of inks with different functional properties, such as conductivity or semiconductor doping. Various circuit components can be formed based on the selected functional property of the composite in the ink. For example, since the processing can be done on a range of substrates, the approaches are suitable for forming flexible circuits. Also, printing approaches, such as inkjet printing, can be particularly useful for forming moderate resolution structures over large areas and/or less expensive structures that are mass produced.

For inkjet printing applications, the use of materials can be significantly reduced due to deposition at desired locations without etching to remove excess material. Inkjet printing with existing equipment can achieve the moderate resolution that is presently needed for many applications. As inkjet technology improves further, the resolution of the printing process can be reduced further. Ink jet printing can be effectively used for very large substrates. For processing approaches with appropriately low temperature cures, the printing can be performed onto a range of flexible substrates.

Coating processes can be used to substitute the functional inks for conventional CVD or similar deposition processes so that the conventional process does not have to be completely redesigned. The coating processes can handle large substrates straightforwardly. In coating deposition approaches, the functional ink deposition and curing can be used as a relatively direct replacement for CVD process. Also, liquid coating processes and curing can be performed on large substrates that are difficult to handle with CVD equipment.

Particle Properties and Formation

The desirable composites and inks described herein are based in part on the ability to form highly uniform inorganic submicron particles, such as elemental inorganic particles, with or without dopants. Laser pyrolysis is a particularly suitable approach for the synthesis of highly uniform elemental inorganic particles. Also, laser pyrolysis is a versatile approach for the introduction of desired dopants at a selected concentration. In some embodiments, the dopants and the dopant concentration can be selected based on the desired electrical properties of the composite material. Also, the surface properties of the inorganic particles can be influenced by the laser pyrolysis process, although the surface properties can be further manipulated after synthesis to form desired dispersions. Small and uniform inorganic particles can provide processing advantages with respect to forming dispersions/inks as well as corresponding composites. In general, the particles have an average diameter of no more than about one micron.

In general, suitable submicron and nano-scale particles can be formed, for example, by laser pyrolysis, flame synthesis or other combustion approaches, although some submicron particles can also be synthesized by solution based approaches. While laser pyrolysis is a desirable approach for particle production, submicron particles can be produced using a flame production apparatus such as the apparatus described in U.S. Pat. No. 5,447,708 to Helble et al., entitled "Apparatus for Producing Nanoscale Ceramic Particles," incorporated herein by reference. Furthermore, submicron particles can be produced with a thermal reaction chamber such as the apparatus described in U.S. Pat. No. 4,842,832 to Inoue et al., "Ultrafine Spherical Particles of Metal Oxide and a Method for the Production Thereof," incorporated herein by reference.

In particular, laser pyrolysis is useful in the formation of particles that are highly uniform in composition and size, as well as crystallinity in appropriate embodiments. Laser pyrolysis involves light from an intense light source that drives the reaction to form the particles. Due to the versatility of laser pyrolysis as an excellent approach for efficiently producing a wide range of nanoscale particles with a selected composition and a narrow distribution of average particle diameters, laser pyrolysis can be used to form inorganic particles and doped inorganic particles with a wide range of selected dopants or combinations of dopants. For convenience, light-based pyrolysis is referred to as laser pyrolysis since this terminology reflects the convenience of lasers as a radiation source and is a conventional term in the art. Laser pyrolysis approaches discussed herein incorporate a reactant flow that can involve gases, vapors, aerosols or combinations thereof to introduce desired elements into the flow stream. The versatility of generating a reactant stream with gases, vapor and/or aerosol precursors provides for the generation of particles with a wide range of potential compositions.

A collection of submicron/nanoscale particles may have an average diameter for the primary particles of less than about 500 nm, in some embodiments from about 2 nm to about 100 nm, alternatively from about 2 nm to about 75 nm, or from about 2 nm to about 50 nm. A person of ordinary skill in the art will recognize that other ranges within these specific ranges are covered by the disclosure herein. Primary particle diameters are evaluated by transmission electron microscopy.

As used herein, the term "particles" refer to physical particles, which are unfused, so that any fused primary particles are considered as an aggregate, i.e. a physical particle. For inorganic particles formed by laser pyrolysis, the particles can be generally effectively the same as the primary particles, i.e., the primary structural element within the material. Thus, the ranges of average primary particle sizes above can also be used with respect to the particle sizes. If there is hard fusing of some primary particles, these hard fused primary particles form correspondingly larger physical particles. The primary particles can have a roughly spherical gross appearance, or they can have rod shapes, plate shapes or other non-spherical shapes. Upon closer examination, crystalline particles may have facets corresponding to the underlying crystal lattice. Amorphous particles generally have a spherical aspect. Diameter measurements on particles with asymmetries are based on an average of length measurements along the principle axes of the particle.

Because of their small size, the inorganic particles tend to form loose agglomerates due to van der Waals and other electromagnetic forces between nearby particles. Even though the particles may form loose agglomerates, the nanometer scale of the particles is clearly observable in transmission electron micrographs of the particles. The particles generally have a surface area corresponding to particles on a nanometer scale as observed in the micrographs. Furthermore, the particles can manifest unique properties due to their small size and large surface area per weight of material. These loose agglomerates can be dispersed in a liquid to a significant degree, and in some embodiments approximately completely to form dispersed primary particles.

The particles can have a high degree of uniformity in size. Laser pyrolysis generally results in particles having a very narrow range of particle diameters. Furthermore, heat processing under suitably mild conditions generally does not significantly alter the very narrow range of particle diameters. With aerosol delivery of reactants for laser pyrolysis, the distribution of particle diameters is particularly sensitive to the reaction conditions. Nevertheless, if the reaction conditions are properly controlled, a very narrow distribution of particle diameters can be obtained with an aerosol delivery system.

As determined from examination of transmission electron micrographs, the primary particles generally have a distribution in sizes such that at least about 95 percent, and in some embodiments 99 percent, of the primary particles have a diameter greater than about 35 percent of the average diameter and less than about 280 percent of the average diameter. In additional embodiments, the primary particles generally have a distribution in sizes such that at least about 95 percent, and in some embodiments 99 percent, of the primary particles have a diameter greater than about 40 percent of the average diameter and less than about 250 percent of the average diameter. In further embodiments, the primary particles have a distribution of diameters such that at least about 95 percent, and in some embodiments 99 percent, of the primary particles have a diameter greater than about 60 percent of the average diameter and less than about 200 percent of the average diameter.

Furthermore, in some embodiments essentially no primary particles have an average diameter greater than about 5 times the average diameter, in other embodiments about 4 times the average diameter, in further embodiments 3 times the average diameter, and in additional embodiments 2 times the average diameter. In other words, the primary particle size distribution effectively does not have a tail indicative of a small number of primary particles with significantly larger sizes. This is a result of the small reaction region to form the inorganic particles and corresponding rapid quench of the inorganic particles. An effective cut off in the tail of the size distribution indicates that there are less than about 1 particle in $10^6$ has a diameter greater than a specified cut off value above the average diameter. High particle uniformity can be exploited in a variety of applications. A person of ordinary skill in the art will recognize that other ranges of uniformity within these specific ranges are contemplated and are within the present disclosure.

In addition, the submicron particles may have a very high purity level. Furthermore, crystalline nanoparticles, such as those produced by laser pyrolysis, can have a high degree of crystallinity. Similarly, the crystalline inorganic nanoparticles produced by laser pyrolysis can be subsequently heat processed to improve and/or modify the degree of crystallinity and/or the particular crystal structure. Impurities on the surface of the particles may be removed by heating the particles to achieve not only high crystalline purity but high purity overall.

The size of the dispersed particles can be referred to as the secondary particle size. The primary particle size is the lower limit of the secondary particle size for a particular collection of particles, so that the average secondary particle size can be approximately the average primary particle size if the primary particles are substantially unfused and if the particles are effectively completely dispersed in the liquid. Secondary particle size measurements can also include a solvation shell around the particles such that primary particle size and secondary particle size are not quantitatively comparable.

The secondary or agglomerated particle size may depend on the subsequent processing of the particles following their initial formation and the composition and structure of the particles. In particular, the particle surface chemistry, properties of the dispersant, the application of disruptive forces, such as shear or sonic forces, and the like can influence the efficiency of fully dispersing the particles. Secondary particles sizes within a liquid dispersion can be measured by established approaches, such as dynamic light scattering. Suitable particle size analyzers include, for example, a Microtrac UPA instrument from Honeywell based on dynamic light scattering, a Horiba Particle Size Analyzer from Horiba, Japan and ZetaSizer Series of instruments from Malvern based on Photon Correlation Spectroscopy. The principles of dynamic light scattering for particle size measurements in liquids are well established.

A small secondary particle size provides for printing of the resultant inks in a small resolution. In general, dispersions with well dispersed particles can be formed at concentrations of up to about 30 weight percent inorganic particles, in other embodiments from about 0.25 to about 20 weight percent and in further embodiments from about 0.5 to about 15 weight percent. In some embodiments, for dispersions with well dispersed particles, the average secondary particle size can be no more than a factor of about four times the average primary particle size, in further embodiments no more than about 3 times the average primary particle size and in additional embodiments no more than about 2 times the average primary particle size. With respect to the particle size distribution, essentially all of the secondary particles can have a size no more than 4 times the Z-average secondary particle size, in further embodiments no more than about 3 times the Z-average particle size and in other embodiments, no more than about 2 times the Z-average particle size. Z-average particle sizes are measured using dynamic light scattering. In some embodiments, the average secondary particle size can approximate the primary particle size. A person of ordinary skill will recognize that additional ranges of concentrations and secondary particle sizes within the explicit ranges above are contemplated and are within the present disclosure. As used herein, reference to essentially all of the particles indicates no more than 1 in one million particles.

A basic feature of successful application of laser pyrolysis for the production of desirable inorganic particles, such as elemental inorganic particles, is the generation of a reactant stream containing one or more precursor compounds and, in some embodiments, a radiation absorber and/or a secondary reactant. The secondary reactant can be a source of atoms for the product particles and/or can be an oxidizing or reducing agent to drive a desired product formation. A secondary reactant may not be used if the precursor decomposes to the desired product under intense light radiation, which generally can be the situation for elemental inorganic particles. Oxygen can be supplied for the formation of metal/metalloid oxide particles. Similarly, a separate radiation absorber may not be used if a reactant absorbs the appropriate light radiation to drive the reaction. Dopant precursors can be introduced into the reactant flow for incorporation into the inorganic particles.

The reaction of the reactant stream is driven by an intense radiation beam, such as a light beam, e.g., a laser beam. In some embodiments, $CO_2$ lasers can be effectively used. As the reactant stream leaves the radiation beam, the inorganic particles are rapidly quenched with particles in present in the resulting product particle stream, which is a continuation of the reactant stream. The concept of a stream has its conventional meaning of a flow originating from one location and ending at another location with movement of mass between the two points, as distinguished from movement in a mixing configuration.

A laser pyrolysis apparatus suitable for the production of commercial quantities of particles by laser pyrolysis has been developed using a reactant inlet that is significantly elongated in a direction along the path of the laser beam. This high capacity laser pyrolysis apparatus, e.g., 1 kilogram or more per hour, is described in U.S. Pat. No. 5,958,348, entitled "Efficient Production Of Particles By Chemical Reaction," incorporated herein by reference. Approaches for the delivery of aerosol precursors for commercial production of particles by laser pyrolysis is described in copending and commonly assigned U.S. Pat. No. 6,193,936 to Gardner et al., entitled "Reactant Delivery Apparatus," incorporated herein by reference. With respect to combined vapor and aerosol delivery approaches, a silicon precursor can be delivered as a vapor, while one or more dopant precursors is delivered as an aerosol. However, for many desirable dopants, suitable dopant precursors can be delivered as a vapor.

In general, the synthesis of a range of submicron particles using laser pyrolysis is described further in published U.S. Patent application 2003-0203205A to Bi et al., entitled "Nanoparticle Production and Corresponding Structures," incorporated herein by reference. Metalloids are elements that exhibit chemical properties intermediate between or inclusive of metals and nonmetals. Metalloid elements include silicon, boron, arsenic, germanium, and tellurium. Metal elements include transition metals as well as other metals. Elements from the groups Ib, IIb, IIIb, IVb, Vb, VIb, VIIb and VIIIb are referred to as transition metals. In addition to the alkali metals of group I, the alkali earth metals of group II and the transition metals, other metals include, for example, aluminum, gallium, indium, thallium, tin, lead, antimony, bismuth and polonium.

The formation of Si and Ge particles through decomposition reactions in laser pyrolysis is described further in copending U.S. patent application Ser. No. 12/006,453 to Hieslmair et al., entitled "SILICON/GERMANIUM PARTICLE INKS, DOPED PARTICLES, PRINTING AND PROCESSES FOR SEMICONDUCTOR APPLICATIONS," incorporated herein by reference. The synthesis of elemental silver nanoparticles using laser pyrolysis and a silver nitrate precursor delivered with by aerosol is described in U.S. Pat. No. 6,391,494 to Reitz et al., entitled "Metal Vanadium Oxide Particles," incorporated herein by reference. The production of iron nanoparticles from iron carbonyl precursors in a decomposition reaction is described further in a publication by Bi et al., entitled "Nanocrystalline α-Fe, $Fe_3C$, and $Fe_7C_3$ produced by $CO_2$ laser pyrolysis," J. Mater. Res. Vol. 8, No. 7 1666-1674 (July 1993), incorporated herein by reference. Nickel nanoparticles from laser pyrolysis of nickel nitrate precursors are described in example 2 of U.S. Pat. No. 6,749,648 to Kumar et al., entitled "Lithium Metal Oxide," incorporated herein by reference.

Suitable silicon precursors for elemental silicon particle formation include, for example, silane ($SiH_4$), disilane ($Si_2H_6$), trisilane ($Si_3H_8$), silicon tetrachloride ($SiCl_4$), trichlorosilane ($SiCl_3H$), and $SiCl_2H_2$. Silane, $SiH_4$, is a convenient precursor for laser pyrolysis since it absorbs infrared light from a $CO_2$ laser and decomposes to form crystalline silicon particles. In other embodiments, a specific light absorber is added to transfer energy to the precursor species, such as ethylene ($C_2H_4$). The higher order silanes similarly decompose to form elemental silicon, i.e. $Si^0$, silicon in its elemental state. Thus, with silane as a precursor, a secondary reactant source may not be used, and a separate infrared absorber is not needed. Corresponding germanes ($GeH_4$ and $Ge_2H_6$) can be used as precursors. For other metals and metalloids, suitable precursors can be selected based on the description herein as well as in the noted laser pyrolysis references. Generally, the conditions in the reactor should be sufficiently reducing to produce the elemental metal/metalloid for the product nanoparticles. An inert gas can be used to moderate the reaction. Suitable inert gases include for example, Ar, He $N_2$ or mixtures thereof.

For silicon formation from silane, low laser fluence can be used to decrease the completion of the reaction so that the resulting particles have a slightly higher hydrogen content. It is expected that an increase in hydrogen content on particle surfaces can improve the dispersability of the particles in liquid hydrocarbon and similar solvents. Low laser fluences can be accomplished through turning down the laser power and/or replacing a cylindrical focusing lens with a non-focusing window.

Laser pyrolysis is a desirable approach for the formation of inorganic particles, which can be formed free of any undesirable contaminants through the use of appropriately pure precursors. If the inorganic particles are generated with hydrogen present, it is expected that bound hydrogen is present along the particle surface as well as within the other portions of the particles. In general, the elemental inorganic particle, such as crystalline silicon particles, can have from about 0.01 atomic percent to about 10 atomic percent, in other embodiments from about 0.025 to about 5 atomic percent and in further embodiments from about 0.05 atomic percent to about 3 atomic percent hydrogen relative to the elemental metal/metalloid. The elemental inorganic particles can similarly comprise other contaminants or modifiers, such as H, N, C, S, O, or combinations thereof in comparable amounts as just described for hydrogen within silicon, whether or not comprising silicon. A person of ordinary skill in the art will recognize that additional ranges of contaminant/modifier concentrations within the explicit ranges above are contemplated and are within the present disclosure.

In general, nanoparticles produced by laser pyrolysis can be subjected to additional processing to alter the nature of the particles, such as the composition and/or the crystallinity. For example, the nanoparticles can be subjected to heat processing in a gas atmosphere prior to use. Under suitably mild conditions, heat processing is effective to modify the characteristics of the particles, such as removal of carbon contaminants, without destroying the nanoscale size or the narrow particle size distribution of the initial particles. For example, heat processing of submicron vanadium oxide particles is described in U.S. Pat. No. 5,989,514 to Bi et al., entitled "Processing Of Vanadium Oxide Particles With Heat," incorporated herein by reference.

Submicron and nanoscale inorganic particles can be produced with selected dopants using laser pyrolysis and other flowing reactor systems. Dopants can be introduced at desired concentrations by varying the composition of the reactant stream. A dopant element or a combination of dopant elements are introduced into the silicon host material by appropriately selecting the composition in the reactant stream and the processing conditions. Thus, submicron particles incorporating selected dopants, including, for example, complex blends of dopant compositions, can be formed.

The doped inorganic particles can be either amorphous solid state blends with the dopant composition dissolved in the host material. For embodiments involving elemental silicon, generally the silicon particles are crystalline, and the dopant can be an intercalation or alloying element. In some embodiments, one or more dopants can be introduced in concentrations in the particles from about $1.0 \times 10^{-7}$ to about 15 atomic percent relative to the metal/metalloid atoms, in further embodiments from about $1.0 \times 10^{-5}$ to about 5.0 atomic percent and in further embodiments from about $1 \times 10^{-4}$ to about 1.0 atomic percent relative to the metal/metalloid atoms. A person of ordinary skill in the art will recognize that additional ranges within the explicit dopant level ranges are contemplated and are within the present disclosure.

Dopants can be introduced to vary properties of the resulting inorganic particles. For example, dopants can be introduced to change the electrical properties of the particles. In particular, As, Sb and/or P dopants can be introduced into the silicon particles to form n-type semiconducting materials in which the dopant provide excess electrons to populate the conduction bands, and B, Al, Ga and/or In can be introduced to form p-type semiconducting materials in which the dopants supply holes. Similarly, dopants can alter the electrical properties of metal/metalloid oxide particles. In general, any reasonable element can be introduced as a dopant to achieve desired properties.

Suitable precursors for aerosol delivery of gallium include, for example, gallium nitrate ($Ga(NO_3)_3$). Arsenic precursors include, for example, $AsCl_3$, which is suitable for vapor delivery, and $As_2O_5$, which is suitable for aerosol precursor delivery in aqueous or alcohol solutions. Suitable boron precursors comprise, for example, diborane ($B_2H_6$), $BH_3$, and the like, and suitable combinations of any two or more thereof. Suitable aluminum precursors include, for example, aluminum hydride ($AlH_3$), aluminum s-butoxide ($Al(OC_4H_9)_3$), trimethyl aluminum ($Al(CH_3)_3$, trimethyl ammonia aluminum $Al(CH_3)_3NH_3$, and the like, and suitable combinations of any two or more thereof. Suitable phosphorous precursor compositions for vapor delivery comprise, for example, phosphine ($PH_3$), phosphorus trichloride ($PCl_3$), phosphorous pentachloride ($PCl_5$), phosphorus oxychloride ($POCl_3$), $P(OCH_3)_3$, and the like, and suitable combinations of any two or more thereof. Suitable antimony precursors include, for example, stibine ($SbH_3$) and antimony trichloride ($SbCl_3$), which is soluble in alcohol.

Figure 2:
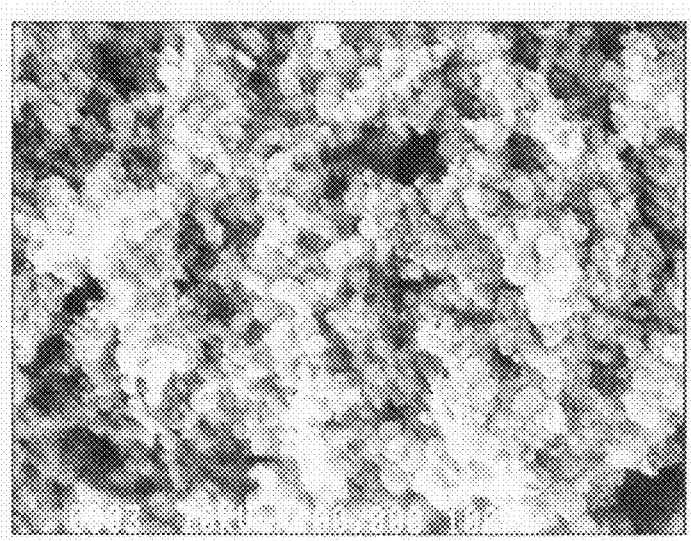
FIG. 2 is a photomicrograph of a second sample of elemental silver nanoparticles.
Figure 3:
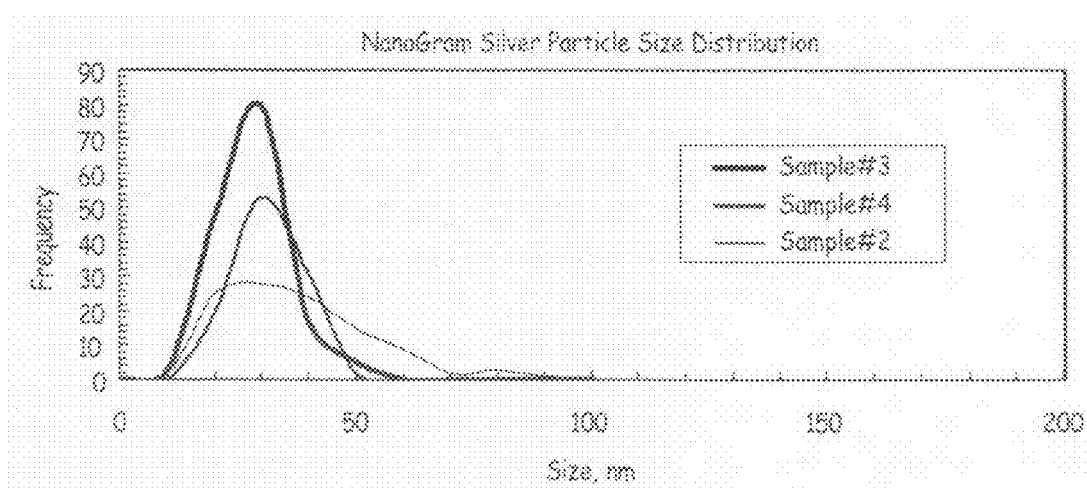
FIG. 3 is a plot of primary particle size distributions for three representative samples of elemental silver nanoparticles.

Referring to FIGS. 1 and 2, photomicrographs are shown of two samples of nanoparticles of elemental silver. These particles were synthesized using laser pyrolysis with an aerosol delivery of silver nitrate. The silver particles had a purity of about 96.5%. Primary particle size distributions are plotted in FIG. 3 for 3 representative samples of nano-silver particles.

Figure 4A:
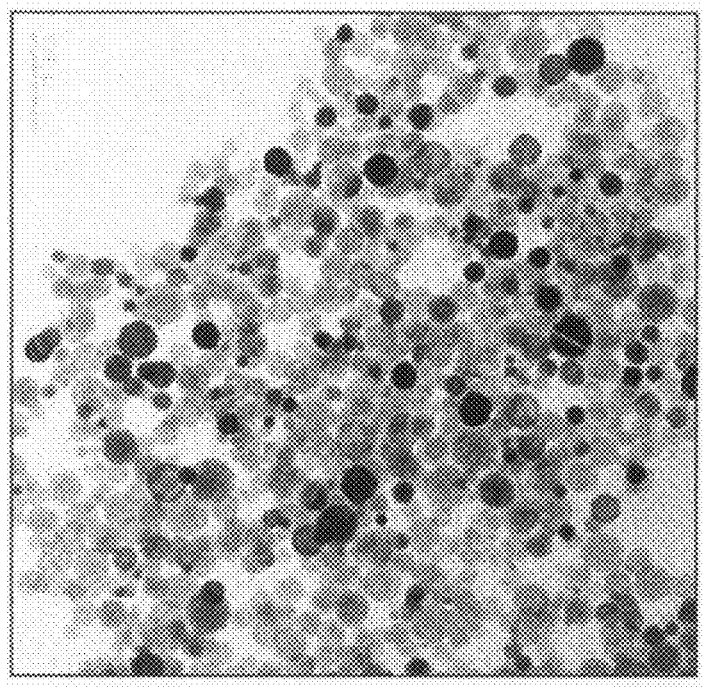
FIG. 4A is a photomicrograph of a sample of elemental silicon nanoparticles at a first magnification.
Figure 4B:
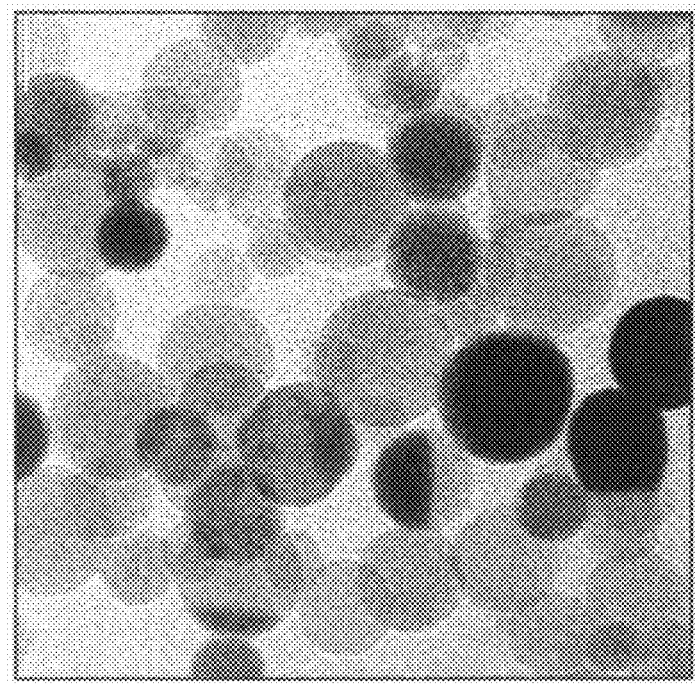
FIG. 4B is a photomicrograph of the sample of elemental silicon nanoparticles of FIG. 4A at a greater magnification.
Figure 5:
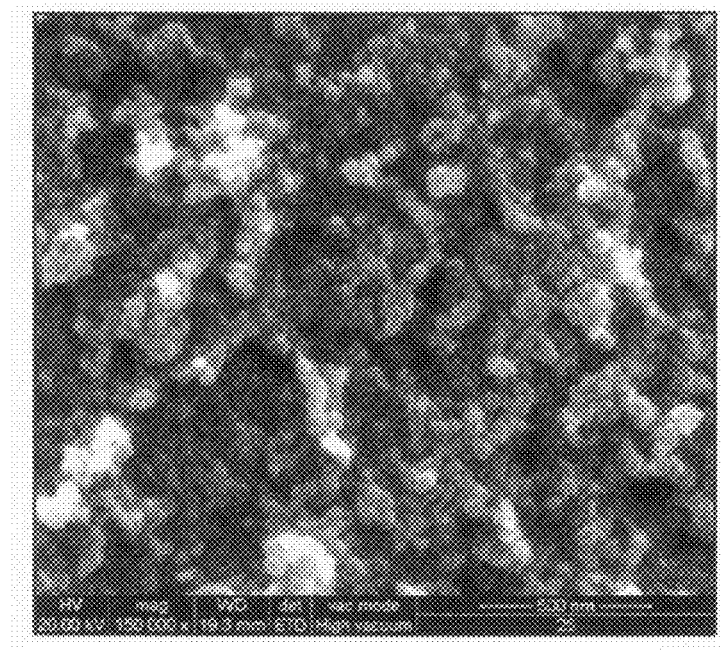
FIG. 5 is a photomicrograph of a second sample of elemental silicon nanoparticles.
Figure 6:
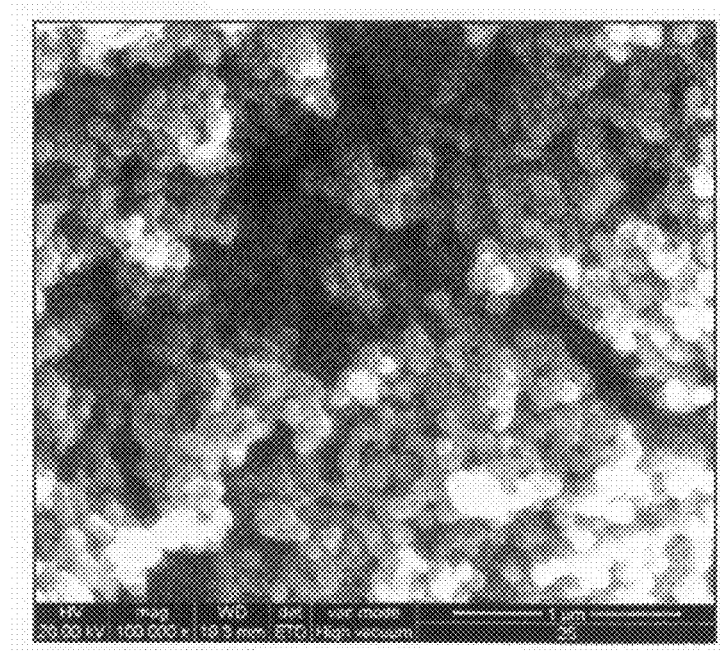
FIG. 6 is a photomicrograph of a third sample of elemental silicon nanoparticles.
Figure 7:
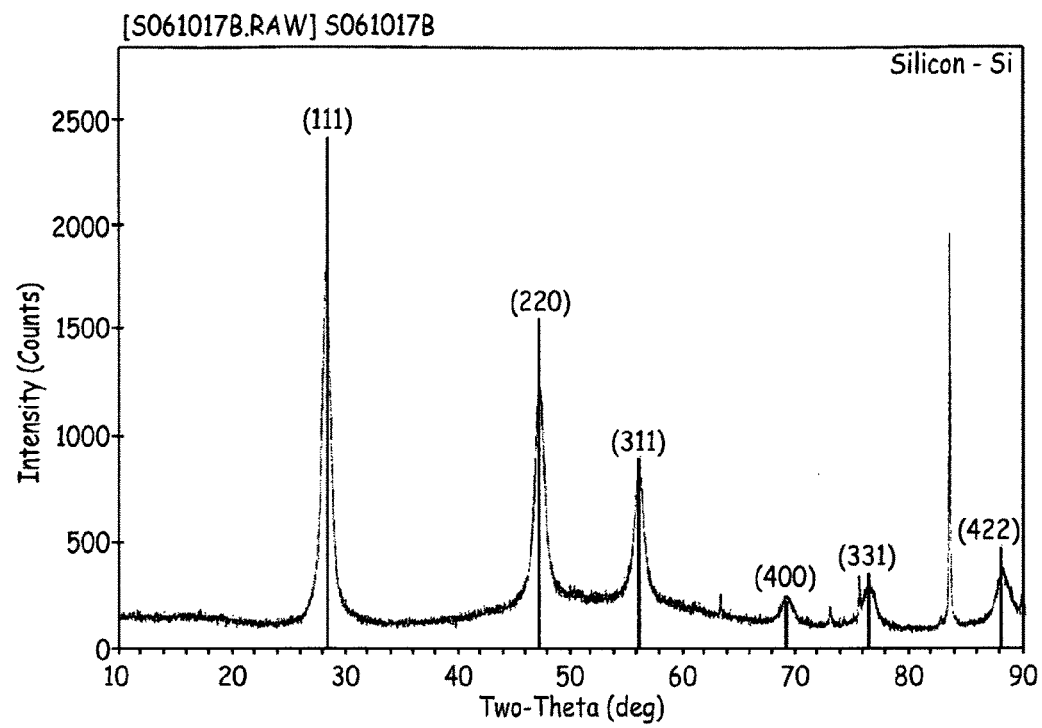
FIG. 7 is an x-ray diffractogram of a sample of elemental silicon having an average primary particle size of about 9 nm.
Figure 8:
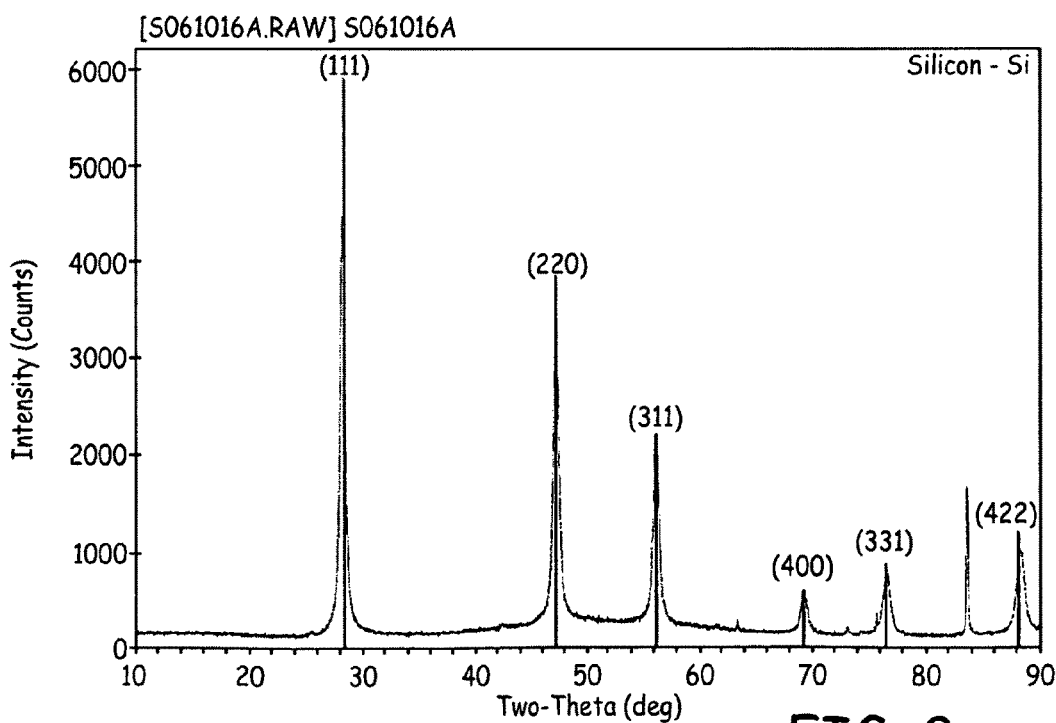
FIG. 8 is an x-ray diffractogram of a sample of elemental silicon having an average primary particle size of about 30 nm.
Figure 9:
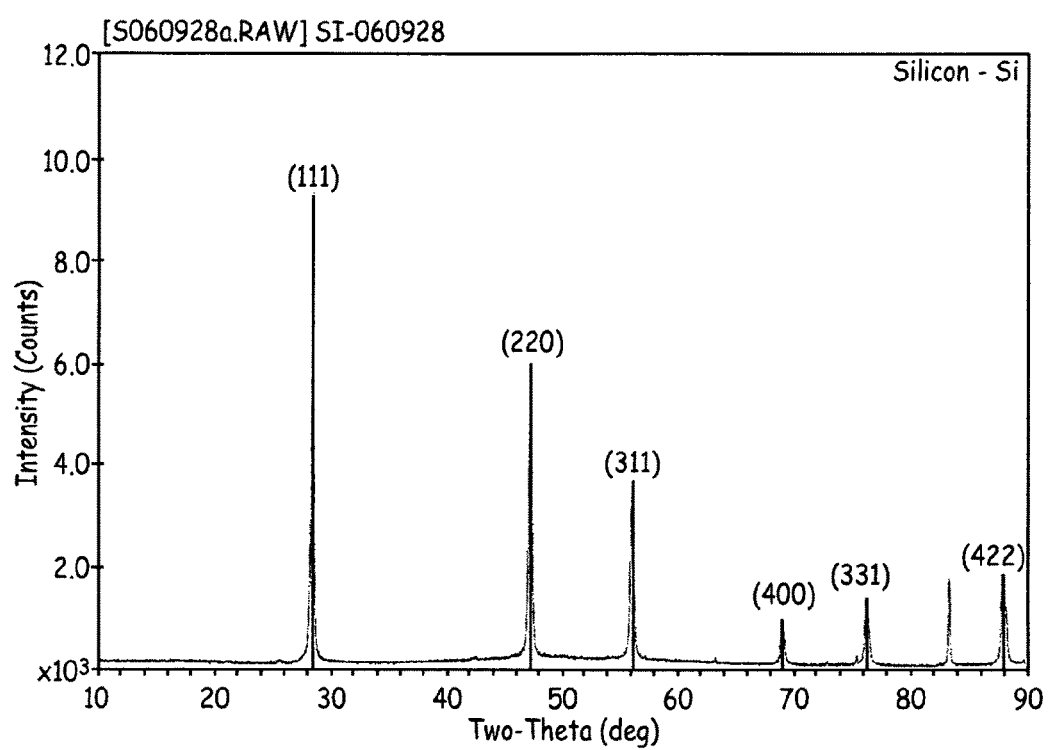
FIG. 9 is an x-ray diffractogram of a sample of elemental silicon having an average primary particle size of about 90 nm.

Referring to FIGS. 4A and 4B, photomicrographs are shown at two magnifications for a sample of elemental silicon nanoparticles synthesized using laser pyrolysis with gaseous silane precursor. Photomicrographs of two additional samples of elemental silicon nanoparticles are shown in FIGS. 5 and 6. Samples with average primary particle sizes from roughly 10 nm to 100 nm can be selectively synthesized. Three x-ray diffractograms for elemental silicon nano-particles are shown in FIGS. 7-9. These samples respectively had 9 nm average particle size with a BET surface area of 290 $m^2/g$, 30 nm average primary particle size with a BET surface area of 86 $m^2/g$ and 90 nm average particle size with a BET surface area of 28 $m^2/g$.

Figure 10:
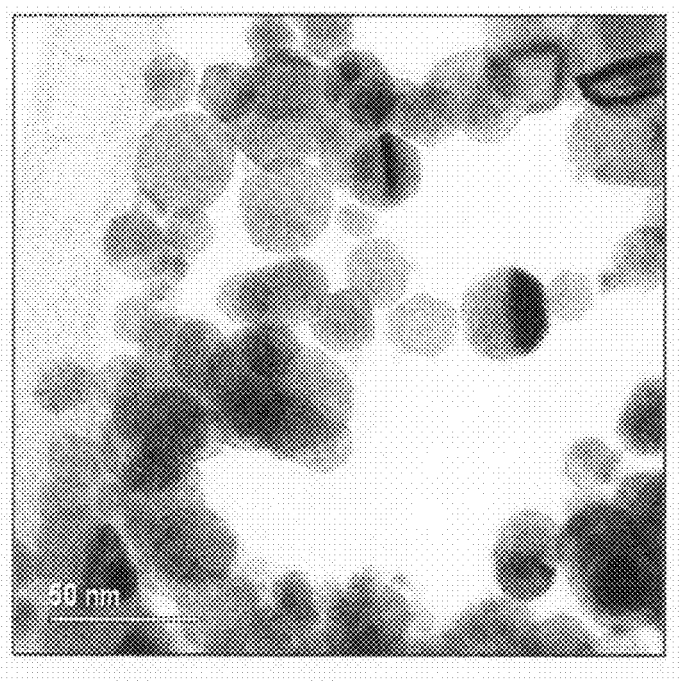
FIG. 10 is a photomicrograph of a sample of elemental nickel nanoparticles having a thin surface oxidation layer.
Figure 11:
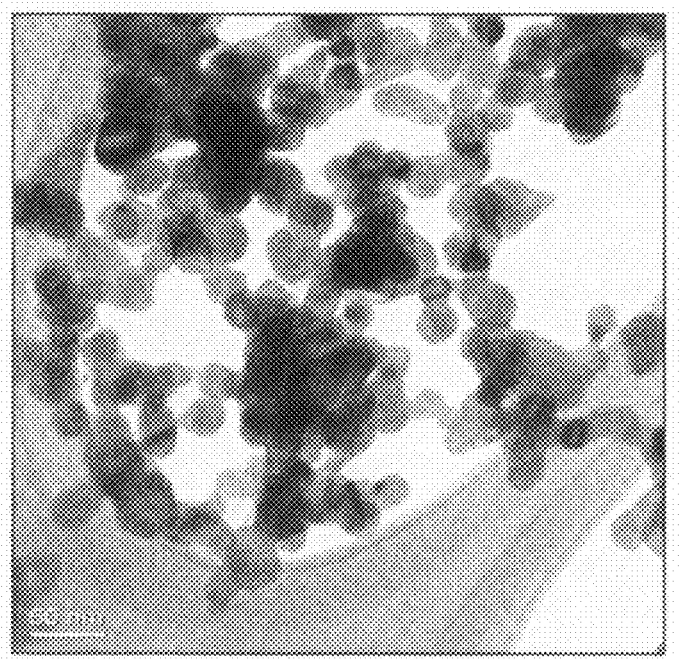
FIG. 11 is a photomicrograph of a sample of elemental nickel nanoparticles that are substantially free of oxidation.

Photomicrographs of elemental nickel nanoparticles are shown in FIGS. 10 and 11. The sample in FIG. 10 had a nickel oxide content of less than about 12 weight percent from exposure to ambient air after synthesis in which the synthesis was performed by laser pyrolysis with aerosol delivery of nickel nitrate. This oxide is thought to form a layer less than 2.5 nm on the particles with an average primary particle size of about 50 nm. The particles in FIG. 11 had a BET surface area of 17.7 $m^2/g$ and were thought to be essentially free of oxide based on x-ray diffraction measurements.

Figure 12:
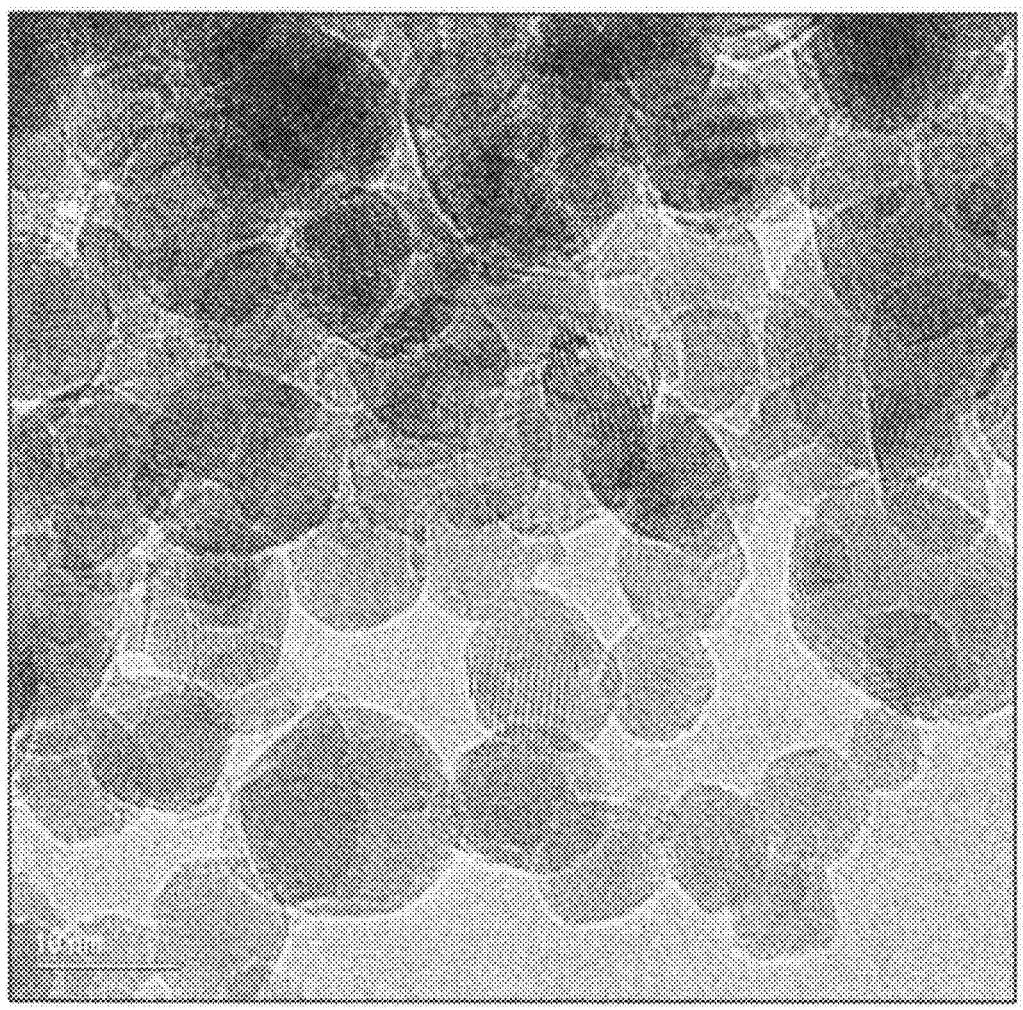
FIG. 12 is a representative transmission electron micrograph for rutile titanium dioxide produced by laser pyrolysis.

A photomicrograph of $TiO_2$ synthesized using laser pyrolysis is shown in FIG. 12. The particles were synthesized using $TiCl_4$ delivered as a vapor with $O_2$ into the reaction chamber. Particles exhibit crystal lattices consistent with rutile phase $TiO_2$. The synthesis of titania particles is described further in copending U.S. patent application Ser. No. 11/645,084 to Chiruvolu et al., entitled "Composites of Polymers and Metal/Metalloid Oxide Nanoparticles and Method for Forming These Composites," incorporated herein by reference.

Figure 13:
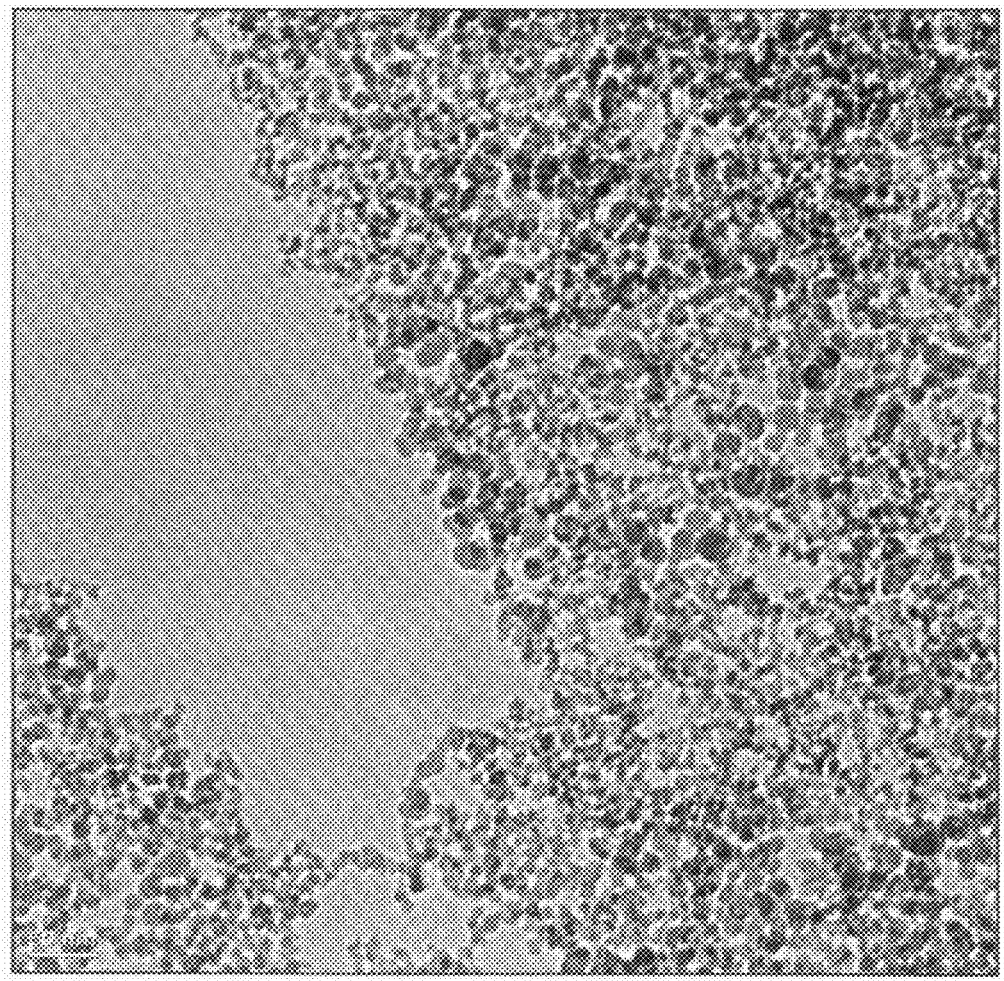
FIG. 13 is a transmission electron micrograph of silica particles synthesized using laser pyrolysis with an aerosol tetraethoxysilane precursor in which the micrograph is taken at a first magnification.
Figure 14:
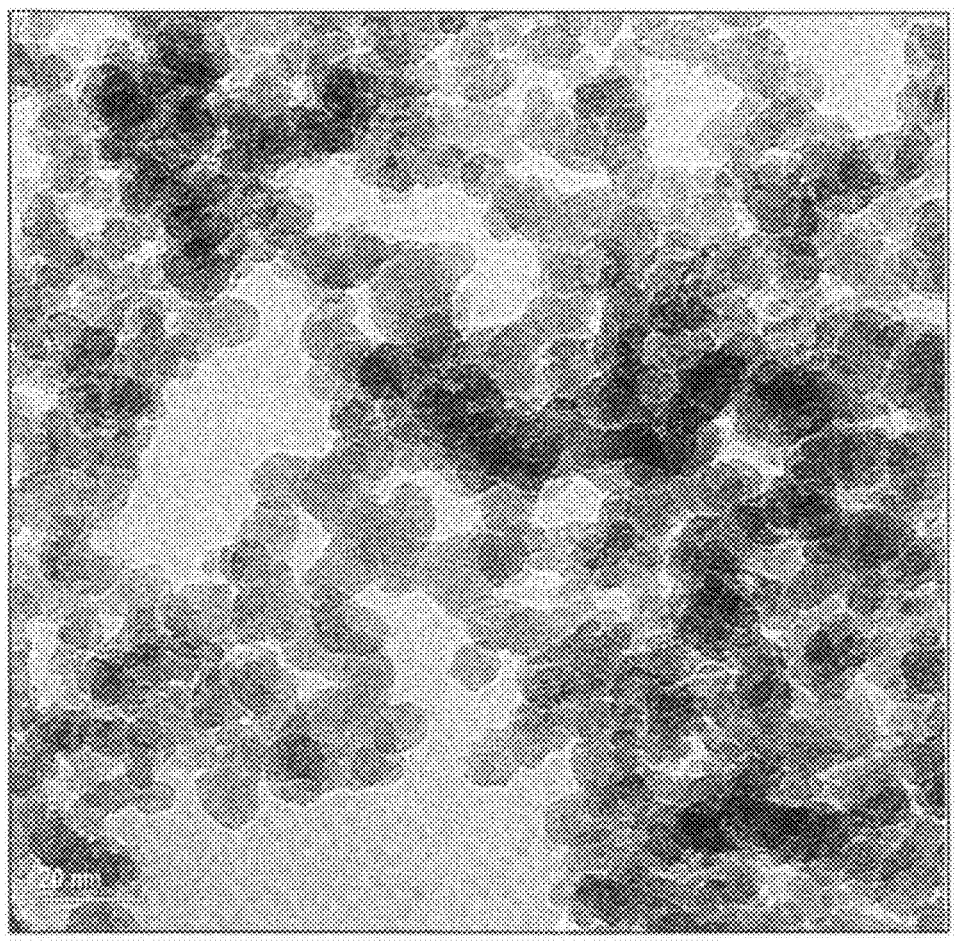
FIG. 14 is a transmission electron micrograph of the sample of FIG. 13 taken at a greater magnification.

Transmission electron micrographs at two magnifications are shown in FIGS. 13 and 14, respectively, for a representative $SiO_2$ nanoparticle sample made from tetraethoxylsilane with $O_2$ using laser pyrolysis. The $SiO_2$ particles had a primary particle size as determined using a transmission electron micrograph of 10-20 nm. The synthesis of $SiO_2$ nanoparticles using laser pyrolysis is described further in copending U.S. patent application Ser. No. 12/006,459 to Hieslmair et al., entitled "Silicon/Germanium Oxide Particle Inks, InkJet Printing and Processes for Doping Semiconductor Substrates," incorporated herein by reference.

Surface Modification and Particle Dispersion Process

The submicron inorganic particles generally are dispersed for further processing or use. In some embodiments, the dispersion can be further stabilized by surface modifying the inorganic particles, such as elemental inorganic particles. Some surface modifying agents can form chemical bonds with the particle surface, while other surface modifying agents have a non-bonding surface affinity for the particle surfaces to function as surface active agents for the particles. Through appropriate selection of the dispersing liquid and the particle surface properties, stable dispersions can be formed at reasonable concentrations. The dispersions can be delivered through suitable coating approaches or printed with the dispersion used as an ink. The surface modification process can involve a switch of dispersants.

Better inorganic particle dispersions are more stable and/or have a smaller secondary particle size indicating less agglomeration. As used herein, stable dispersions have no settling without mixing after one hour. In some embodiments, the dispersions exhibit no settling of particles without mixing after one day and in further embodiments after one week, and in additional embodiments after one month. In general, dispersions with well dispersed particles can be formed at concentrations of at least up to 30 weight percent inorganic particles. Generally, for some embodiments it is desirable to have dispersions with a particle concentration of at least about 0.05 weight percent, in other embodiments at least about 0.25 weight percent, in additional embodiments from about 0.5 weight percent to about 30 weight percent and in further embodiments from about 1 weight percent to about 20 weight percent. A person of ordinary skill in the art will recognize that additional ranges of stability times and concentrations within the explicit ranges above are contemplated and are within the present disclosure.

In general, if processed appropriately, for dispersions with well dispersed inorganic particles, the average secondary particle size can be no more than a factor of four times the average primary particle size, in further embodiments no more than about 3 times the average primary particle size and in additional embodiments no more than about 2 times the average primary particle size. In some embodiments, the volume-average particle size is no more than about 1 micron, in further embodiments no more than about 250 nm, in additional embodiments no more than about 100 nm, in other embodiments no more than about 75 nm and in some embodiments from about 5 nm to about 50 nm. With respect to the particle size distribution, in some embodiment, essentially all of the secondary particles can have a size no more than 5 times the volume-average secondary particle size, in further embodiments no more than about 4 times the volume-average particle size and in other embodiments no more than about 3 times the average particle size. Furthermore, the DLS particle size distribution by volume can have in some embodiments a full width at half-height of no more than about 50 percent of the volume-average particle size. Also, the secondary particles can have a distribution in sizes such that at least about 95 percent of the particles have a diameter greater than about 40 percent of the average particle size and less than about 250 percent of the average particle size. In further embodiments, the secondary particles can have a distribution of particle sizes such that at least about 95 percent of the particles have a particle size greater than about 60 percent of the average particle size and less than about 200 percent of the average particle size. A person of ordinary skill in the art will recognize that additional ranges of particle sizes and distributions within the explicit ranges above are contemplated and are within the present disclosure.

Z-average particle sizes can be measured using dynamic light scattering. The Z-average particle size is based on a scattering intensity weighted distribution as a function of particle size. Evaluation of this distribution is prescribed in ISO International Standard 13321, Methods for Determination of Particle Size Distribution Part 8: Photon Correlation Spectroscopy, 1996, incorporated herein by reference. The Z-average distributions are based on a single exponential fit to time correlation functions. However, small particles scatter light with less intensity relative to their volume contribution to the dispersion. The intensity weighted distribution can be converted to a volume-weighted distribution that is perhaps more conceptually relevant for evaluating the properties of a dispersion. For nanoscale particles, the volume-based distribution can be evaluated from the intensity distribution using Mie Theory. The volume-average particle size can be evaluated from the volume-based particle size distribution. Further description of the manipulation of the secondary particle size distributions can be found in Malvern Instruments—DLS Technical Note MRK656-01, incorporated herein by reference.

In general, a suitable dispersing liquid to disperse well the inorganic particles depends on the surface chemistry of the particles, which can be evaluated empirically. In some embodiments, silicon particles formed by laser pyrolysis can be well dispersed in a polar organic liquid at moderate concentrations with no surface modification, although higher concentration dispersions generally can be formed with surface modification. Upon surface modification, the silicon particles can be dispersed in a broader range of solvents and solvent blends through the matching of the chemical properties of the surface modifying agent with the liquid. Thus, following surface modification different liquid may be suitable as dispersing liquids for the particles. If surface modification moieties are appropriately selected, following surface modification, the particles can be well dispersed in a range of less polar solvents, such as ethyl lactate, n-methyl pyrrolidinone, gamma-butyl lactone and the like.

The surface modification of inorganic particles, e.g., silicon particles, can improve stability of the particle dispersions and provide for dispersion of the particles in a wider range of liquids and potentially at higher concentrations. While some surface modifiers can merely coat the surface, some desirable surface modifiers chemically bond to the particle surface. For convenience of terminology, a chemically bonded surface modifying compound refers to a compound that adds at least 3 atoms to the particle surface when it bonds to the particle surface, to distinguish compositions, that modify the surface of an inorganic particle such as through the introduction of an M-OH group or an M-Cl group, where M is a metal or metalloid atom. In general, it is expected that the presence of a dopant does not significantly alter the surface modification process or chemistry. A range of surface modifying compounds can be used to chemically bond to the elemental inorganic particle surfaces. Suitable functional groups for bonding to inorganic particles with different compositions are described in U.S. Pat. No. 6,599,631 to Kambe et al, entitled "Polymer-Inorganic Particle Composites," incorporated herein by reference.

Elemental inorganic particles can be exposed to an oxidizing environment to form a surface oxide layer. This oxide layer can provide for surface modification of the particles with the particles having the surface chemistry of an oxide. In particular, alkoxysilanes react with metal/metalloid oxides at the surface of particles to form M-O—Si— bonds to form a stable surface coating with the release of a corresponding compound from the displaced alkoxy silane functional group. For bonding with some surface modification agents, an improved surface coating can be achieved with improved —OH functional group coverage on the surface of the particles.

The O—H surface functional groups improve the dispersability of the particles in alcohols, such as, methanol or propylene glycol. Suitable surface modifiers include, for example, monoalkoxysilanes, dialkoxysilanes, trialkoxysilanes and combinations thereof with a selected functional group bonding to the silicon atom of the silane. Metal/metalloid oxide particles can have similar surface chemistry. The formation of metal oxide particle dispersions and polymer composites is described further in copending U.S. patent application Ser. No. 11/645,084 filed on Dec. 22, 2006, entitled "Composites of Polymer and Metal/Metalloid Inorganic Nanoparticles and Method for Forming These Composites," incorporated herein by reference, which is referred to below as the '084 application. Other particles can be similarly well dispersed with suitable attention to the particle surface chemistry.

In particular, trialkoxysilanes provide very stable bonding to oxidized particle surfaces with potentially three points of bonding. The fourth side chain of the trialkoxysilanes provides the ability to influence the dispersability and other surface properties of the surface modified inorganic particles. Specifically, the fourth side chain of the silane can be selected to improve disperability in a selected solvent and/or to provide a reactive functional group for further processing. Similarly, polydialkoxysiloxy silanes provide stable bonding with the ability of each monomer unit to form two bonds to the particle. The siloxane polymer can wrap around the particles during the bonding process. In addition to alkoxy silanes, chemical compounds with other functional groups can form bonds to an oxidized surface of elemental inorganic particles. Specifically, surfaces with halogen groups, such as chloride (-MCl) groups, some amine groups, carboxylic acid groups and hydroxide groups can also bond to oxidized metal/metalloid particle surfaces. Additional functional groups of these compounds can be similarly selected to yield desirable properties for the resulting surface modified particles.

With respect to the alkoxy side chains of silanes, methoxy groups and ethoxy groups have been found to be effective in reacting with inorganic oxide particle surfaces, and a range of compounds with these functional groups are commercially available. Suitable fourth functional groups for the trialkoxy silanes include, for example, alkyl groups, epoxide groups ($-(CH_2)_nCHCH_2O_{bridge}$), methacryloxyalkyl ($-(CH_2)_nOOC=CH_2$), isocyanate ($-(CH_2)_nNCO$), thiol ($-(CH_2)_nSH$), acetyl ($-(CH_2)_nOOCCH_3$), hydroxybenzophenyl ($-(CH_2)_nOC_6H_5(OH)COC_6H_5$), allyl ($-CH_2CH=CH_2$), and phenethyl ($-(CH_2)_nC_6H_5$). At least some of these functional groups can provide for crosslinking with polymer functional groups. In general, the surface modifying compound can be coated at a coverage from less than a monolayer to four or more monolayers as well as values between. The amount of coverage can be estimated based on the surface area of the particles and the amount of compound that can be expected to pack along the particle surface.

Other surface modification chemistry for elemental inorganic particles can be used. In particular, oxidized elemental inorganic particle surfaces can be reacted to form hydrogenated surfaces, and the resulting M-H groups can be functionalized with organic compounds. In other embodiments, unoxidized metal/metalloid particle surfaces can be reacted with $Cl_2$ to form M-Cl bonds that are susceptible to nucleophilic substitution to provide desired functionalization of the elemental inorganic particle surface.

The surface modification of the elemental inorganic particle can be performed with a non-chemical bonding particle surfactant. Chemical bonding refers to bonding having some significant covalent character or ligand-metal bonding contributions. The particle surfactant is selected to have significant surface interaction with the particle surface that can involve hydrogen bonding interactions and/or a plurality of non-bonding interactions that can result in a significant affinity for the particle surface such that equilibrium with the solvent can result in significant accumulation of particle surfactant along the particle surface.

Suitable surfactants can be selected for the particular inorganic particles and may be cationic surfactants, anionic surfactants, non-ionic surfactants and/or zwitter ionic surfactants. For these applications, the selection of the surfactant can be influenced by the particular dispersing liquid as well as the properties of the particle surfaces. In general, surfactants are known in the art. The surfactant can be selected to have significant binding affinity for the particle surface. Also, blends of surfactants can be helpful to combine the desired features of different surfactants, such as improve the dispersion stability. The surfactant or additional surfactants can be selected to also alter the rheological properties of the ink, as described further below. In some embodiments, the dispersions can have particle surfactant concentrations from about 0.01 to about 5 weight percent, and in further embodiments from about 0.02 to about 3 weight percent.

In some embodiments, the surface modifying compound, whether or not chemically bonded to the particle surface, comprises an aromatic functional group following association with the particle surface. Suitable aromatic functional groups can be hydrocarbon groups, such as phenyl groups, benzyl, indeneyl, hydroxybenzophenyl, ethylphenyl, triphenyl amine or naphthyl groups. Other suitable aromatic groups have hetero atoms on the aromatic ring, such as pyridinyl and indolyl groups. In some embodiments, side groups off of the aromatic groups can be used for covalent bonding with the organic binder, e.g., polymer.

One of at least two processes can be used to perform a surface modification of the inorganic particles. In one approach, an unstable, higher concentration dispersion can be formed with the inorganic particles, and the surface modification is performed to stabilize the higher concentration dispersion. However, better particle dispersions generally are obtained through first forming a dilute, relatively stabile dispersion of the particles without surface modification and then performing the surface modification.

In the direct approach, the liquid is selected to balance the dispersion of the unmodified inorganic particles, the solubility of the surface modifying compound unbound to the particles and the dispersion of the particles following surface modification. Generally, the liquid is not a particularly good dispersant for the unmodified particles. Similarly, the liquid may not be a good solvent for the surface modifying agent. But if the surface modifying agent is somewhat soluble in the liquid and the unmodified particles can be dispersed with mixing, the surface modification reaction can be performed. As the particles become surface modified, the dispersion may stabilize as the reaction proceeds.

Better dispersion results generally can be obtained if the inorganic particles without a surface modifier are first stably dispersed with a desirably small average secondary particle size. Alcohols and water/alcohol blends generally are good dispersants for metal/metalloid particles with surface oxidation. The surface modifying compound can be added directly into the dispersing liquid if it has some solubility, or the surface modification compound can be dissolved into a solvent that is miscible with or soluble in the liquid of the particle dispersion. After the surface modification is complete, the particles can be transferred to a different dispersing liquid as described below. The surface modified particles can be stored or shipped in a liquid suitable for further processing.

In general, to change dispersing liquids, it has been found effective to settle the particles by forming a liquid mixture in which the stability of the dispersion is lost. Centrifugation or filtration can be used to efficiently separate the particles from the liquid once they are no longer stably dispersed. If the particles are centrifuged, the liquid is decanted from the precipitated particles. The particles can be washed one or more times with a selected dispersing liquid to remove residual amounts of the original liquid. Then, the particles can be redispersed in the selected liquid. In this way, the liquid can be changed for a later processing step through the selection of a surface modifier that facilitates dispersion in the selected liquid.

Following surface modification and/or at other stages of the dispersion process, the dispersion can be filtered to remove contaminants and or any stray unusually large particles. Generally, the filter is selected to exclude particulates that are much larger than the average secondary particle size so that the filtration process can be performed in a reasonable way. In general, the filtration processes have not been suitable for overall improvement of the dispersion quality. Suitable commercial filters are available, and can be selected based on the dispersion qualities and volumes.

Figure 15:
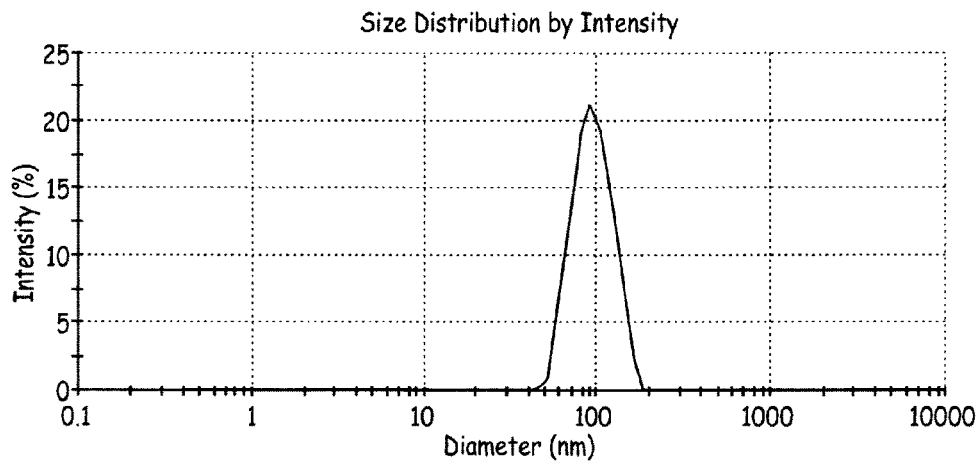
FIG. 15 is a plot of particle size distribution by DLS of a dispersion for nanoscale silicon particles in propylene glycol at 0.5 weight percent.
Figure 16:
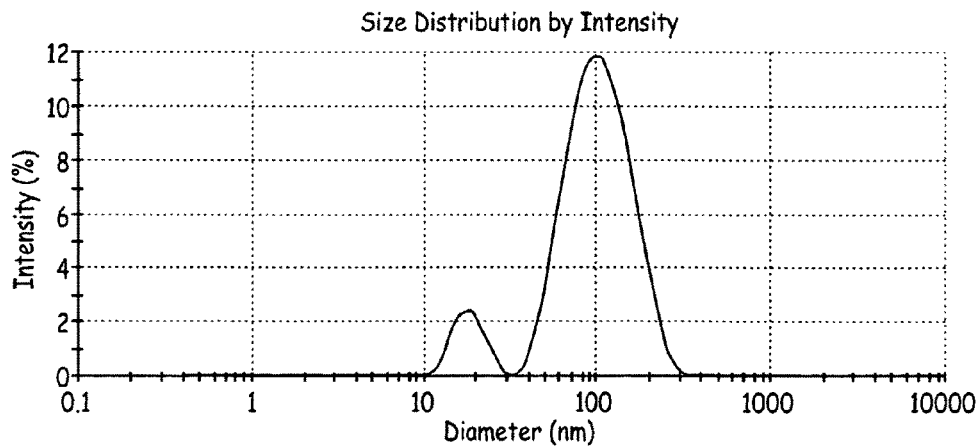
FIG. 16 is a plot of particle size distribution by DLS of a dispersion for nanoscale silicon particles with a surface modification in gamma butylactone at 1.0 weight percent.

Dispersions were formed with elemental silicon nanoparticles. The secondary particle size measurements in propylene glycol are plotted in FIG. 15 for a 0.5 weight percent dispersion. The powders used in this dispersion example had a BET surface area of 69.9 $m^2/g$. The secondary particle size was also measured for surface modified silicon nanoparticles. The powders for this dispersion had a BET surface area of 77 $m^2/g$, and the particles were surface modified with methacryloxypropyl trimethoxysilane (Z6030, Dow Corning). The size distribution of the resulting 1 weight percent dispersion was measured by DLS, and the plot of the particle size distribution is shown in FIG. 16. The distribution had a Z-average particle size of 72.0 nm with two peaks, with a smaller peak at 17.9 nm and a larger peak at 108 nm.

Figure 17:
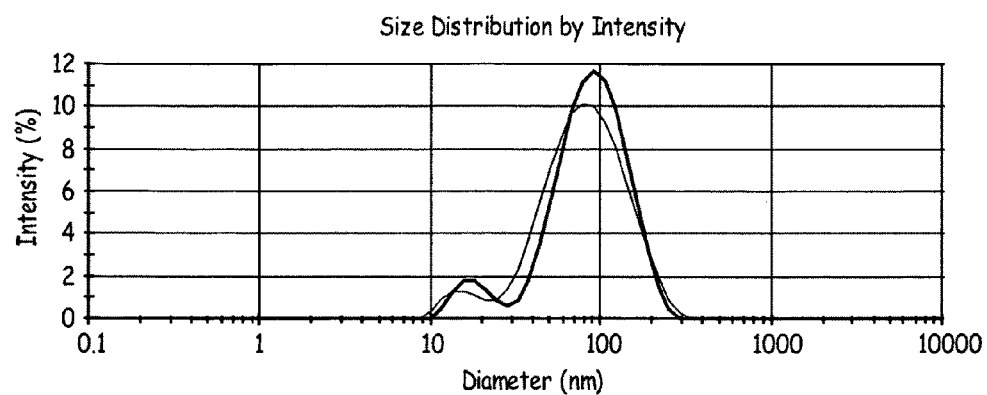
FIG. 17 is a plot of the particle size distribution by DLS of a dispersion for nanoscale silicon particles with and without surface modification in ethyl lactate at 1.0 weight percent.

Another silicon nanoparticle powder was formed into a dispersion with measurements obtained before and after surface modification. The powders had a surface area 74 $m^2/g$ as measured by BET. The surface modification was performed with methacryloxypropyltrimethyloxysilane surface modification agent. The intensity-based particles size distributions obtained by DLS for a 1 weight percent dispersion both before (A) and after (B) surface modification are shown in FIG. 17. After surface modification, the intensity average particle size distribution is smaller than before surface modification.

Figure 18:
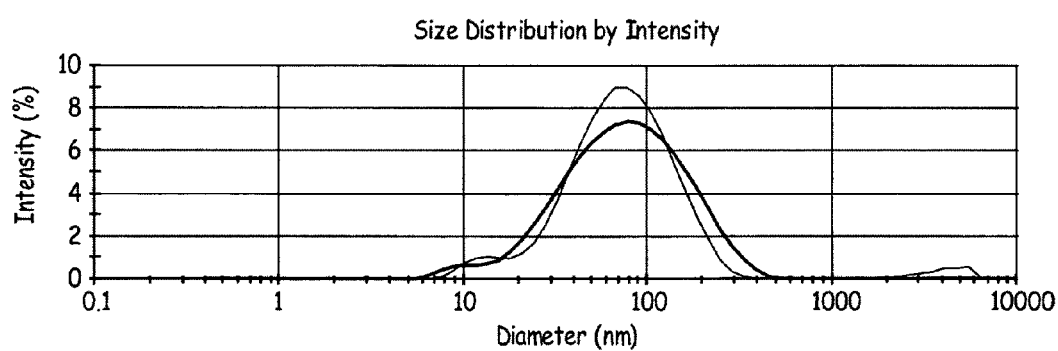
FIG. 18 is a plot of the particle size distribution by DLS of a dispersion for nanoscale silicon particles with a surface modification in ethyl lactate formed at 5 weight percent concentration and diluted to 1.0 weight percent for the DSL measurement.

A similar sample was prepared as a 5 weight percent dispersion. The high optical density of the sample prohibited acquisition of DLS data at such a high concentration. To obtain DLS measurements, the samples were diluted to 1 weight percent. The intensity-based particles size distributions obtained by DLS for the diluted sample both without surface modification (A) and with surface modification (B) are shown in FIG. 18. Dispersions of elemental silicon nanoparticles are described further in copending U.S. patent application Ser. No. 12/006,453 to Hieslmair et al., entitled "SILICON/GERMANIUM PARTICLE INKS, DOPED PARTICLES, PRINTING AND PROCESSES FOR SEMICONDUCTOR APPLICATIONS," incorporated herein by reference.

Figure 19:
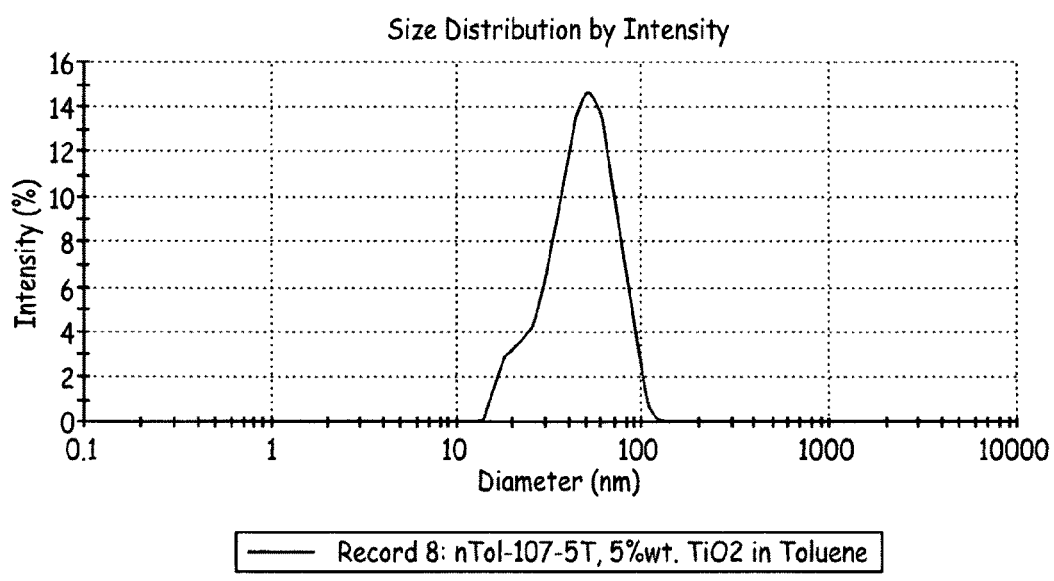
FIG. 19 is a plot of the particle size distribution by DLS of a dispersion for surface modified nanoscale titanium dioxide in toluene at 5 weight percent.

The secondary particle size of $TiO_2$ in a 5 weight percent toluene dispersion was determined by dynamic light scattering, and the measured particle size distribution is shown in FIG. 19. The particles were surface modified with octadecyl trimethoxy silane. The formation of titania dispersions is described further in copending U.S. patent application Ser. No. 11/645,084 to Chiruvolu et al., entitled "Composites of Polymers and Metal/Metalloid Oxide Nanoparticles and Method for Forming These Composites," incorporated herein by reference.

Figure 20:
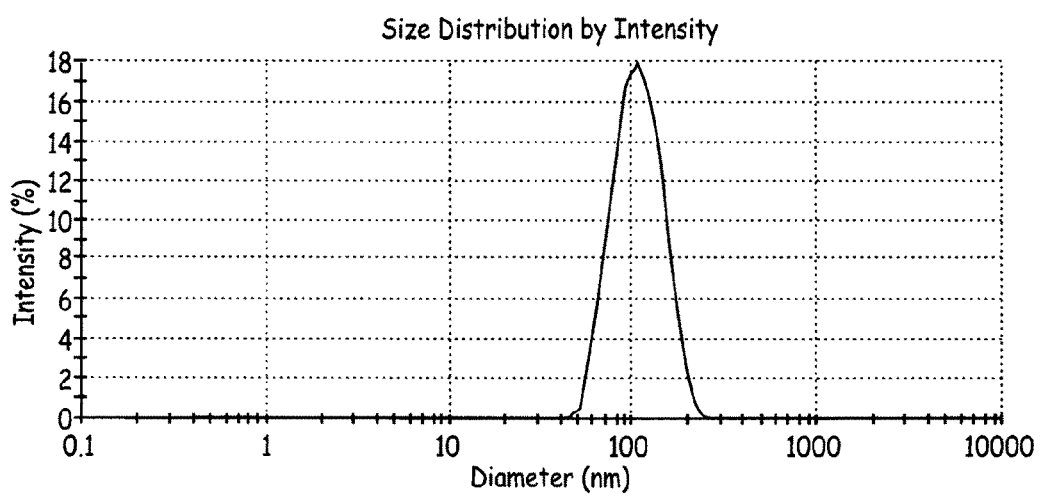
FIG. 20 is a plot of the particle size distribution by DLS of a dispersion for surface modified nanoscale silicon dioxide in isopropyl alcohol at 1 weight percent.
Figure 21:
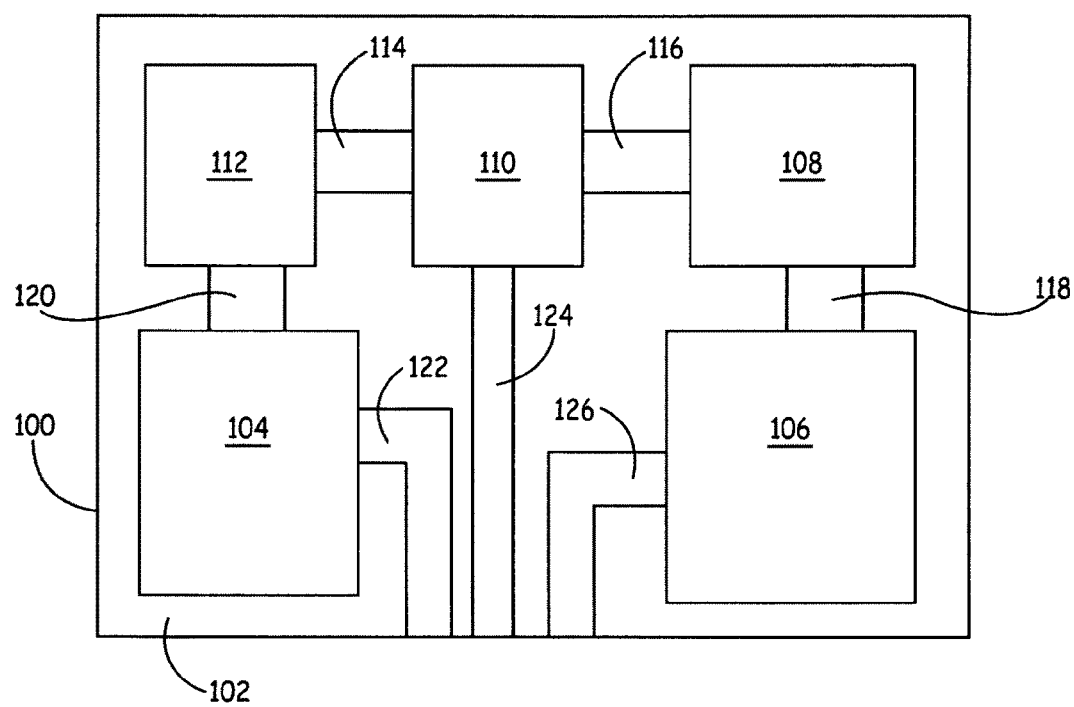
FIG. 21 is a schematic diagram of a printed electronic circuit.

$SiO_2$ particles have been shown to form good dispersions in isopropyl alcohol at 1% wt after modification with N-(2-aminoethyl)-3-aminopropyltrimethoxysilane. The distribution of the size of the particles revealed from DLS measurement is shown in FIG. 20 where the particles had an average secondary particle size of about 99.7 nm. The formation of silica dispersions are described further in copending U.S. patent application Ser. No. 12/006,459 to Hieslmair et al., entitled "Silicon/Germanium Oxide Particle Inks, InkJet Printing and Processes for Doping Semiconductor Substrates," incorporated herein by reference.

Composite Compositions

The composite comprises a blend of inorganic particles, such as elemental inorganic particles, within an organic matrix, e.g. a polymer binder or semiconducting composition. In some embodiments, it is desirable for the composite to have a high concentration of inorganic particles in which the particles are selected to contribute desired functionality to the composite. The organic matrix functions as a binder for the particles and may contribute to the functionality of the composite in some embodiments. In general, it is desirable for the inorganic particles to be well dispersed within the composite since good dispersion can result in improved and more predictable functionality for the composite. This uniformity of the particle distribution can be indirectly inferred through the resulting properties of the composite, and the particles can be observed in the composite, for example, using transmission electron microscopy for films and/or scanning electron microscopy for cross sections and surfaces of thicker films.

In some embodiments, the composite can comprise from low inorganic particle concentrations to up to at least about 80 weight percent inorganic particles. While in some embodiments, a low particle loading may provide desired composite properties, in general higher inorganic particle loading composites generally have a loading from about 15 weight percent to about 80 weight percent, in further embodiments from about 20 to about 75 weight percent, and in other embodiments from about 25 to about 65 weight percent. These particle concentrations can be expressed in term of volume percents. In general, the composite comprises inorganic particles no more than about 75 volume percent, in further embodiments from about 10 to about 70 volume percent, in other embodiments from about 15 to about 65 volume percent and in additional embodiments from about 20 to about 50 volume percent. Volume percents are evaluated from the weights of the component materials, which are used to obtain component volumes based on bulk densities. A person of ordinary skill in the art will recognize that additional ranges of particle loadings within the explicit ranges above are contemplated and are within the present disclosure.

The functional composites generally have properties contributed by the inorganic particles, such as elemental inorganic particles, if the composites have high particle loadings. In some embodiments, the particles are semiconductors and the organic binder may or may not comprise semiconducting polymers or other organic semiconducting compositions. If the composites have high particle loadings and have more uniformly distributed particles as described herein, the semiconducting properties of the composites can be enhanced, for example, with respect to higher charge carrier mobilities. Aromatic side chains of a surface modifying moiety can contribute to the uniformity of the composite as well as the electrical properties if aromatic semiconducting compositions, e.g., polymer, are used. In some embodiments, the inorganic particles are dielectrics, and the organic binder may or may not be a semiconducting organic composition. The composite of the dielectric inorganic particles and a semiconducting organic composition can form a stable dielectric composite.

In other embodiments, the inorganic particles, such as elemental inorganic particles, can be electrical conductors. Similar enhancements can be expected based on high uniformity of the composite. Also, the electronic properties of a surface modifying moiety as well as the electronic properties of the organic polymer can also significantly influence the electronic properties of the composite. Improvements in composite function can also be anticipated for elemental inorganic particles having other functional properties, such as inductive properties, if the particles are more uniformly distributed in the organic matrix.

In contrast with the composites described herein, composites without processing to form uniform composites may not have desired contributions from the inorganic particles to the functional properties of the composite. See, U.S. Pat. No. 7,057,206 to Halik et al., entitled "Silicon Particles as Additives for Improving Charge Carrier Mobilities in Organic Semiconductors," incorporated herein by reference. The composites described in the '206 patent would not be expected to have uniformity of the particles in the composite. As a result, the composite described in the '206 patent would not have improved performance characteristics corresponding to the highly uniform composites described herein. In general, organic semiconductors have a charge carrier mobility two or more orders of magnitude below values for silicon-based semiconductors, and the increase in mobilities found in the '206 patent are modest relative to the semiconducting polymers alone.

As noted above, surface modifying moieties can have functional groups that form covalent bonds with functional groups of the organic binder. With these linkers, an effective crosslinking results with the particles incorporated into the crosslinked network. This crosslinking can facilitate the formation of more uniform composites and can stabilize the composite. Crosslinked inorganic particle-polymer composites are described further in U.S. Pat. No. 6,599,631 to Kambe et al., entitled "Polymer-Inorganic Particle Composites," incorporated herein by reference. In general, the organic binder can possess functional side groups and/or terminal sites for polymeric binders that can be chemically bonded with the inorganic particles and/or with functional groups of a surface modifying composition.

Suitable polymers include, for example, organic polymers, organo-silicon-based polymers and mixtures thereof. Suitable organic polymers include, for example, polyamides (nylons), polyimides, polycarbonates, polyurethanes, polyacrylonitrile, polyacrylic acid, polyacrylates, polyacrylamides, polyvinyl alcohol, polyvinyl chloride, heterocyclic polymers, polyesters, modified polyolefins and mixtures and reasonable copolymers thereof. Composites formed with nylon polymers, i.e., polyamides, and inorganic nanoparticles can be called Nanonylon™. Suitable organo-silicon-based polymers include, for example, polysilanes and polysiloxane (silicone) polymers, such as poly(dimethylsiloxane) (PDMS) and poly(methylphenyl siloxane) (PMPS). Polysiloxanes can be desirable polymers because of their transparency to visible and ultraviolet light, high thermal stability, resistance to oxidative degradation and their hydrophobicity. Other inorganic polymers include, for example, phosphazene polymers (phosphonitrile polymers). The polymers can be crosslinked to provide desired mechanical properties to the composite.

Suitable semiconducting polymers include, for example, conjugated polymers, such as poly(phenylene vinylene)s, polypyrroles, polyisothianaphenes, poly(paraphenylene)s, polyphenylenes, polythiophenes, polyvinylthiophenes, polynaphthalene derivatives, polyanilines, polyperfluorines, polyspirobisfluorines, polypyridines, polypyrrols, copolymers thereof and mixtures thereof. Poly(phenylene vinylene)s include, for example, poly(2,5-bis(cholestanoxy)-1,4-phenylene vinylene) (BCHA-PPV) and poly(2-methoxy-5-(2'-ethylhexyloxy)-1,4-phenylene vinylene)(MEH-PEV). The formation of solutions in organic solvents of organic semiconducting polymers and control of the properties of these solutions for printing and the like is described further in U.S. Pat. No. 7,252,781 to Spreitzer et al., entitled "Solutions of Polymer Semiconductors," incorporated herein by reference. Suitable organic solvents generally include, for example, toluene, anisol, xylenes, pyridine, dioxane, other ethers, and the like.

Oligomer organic semiconductors are described further in published PCT application WO 2007/039574A, entitled "Phenylene-Thiophene Oligomers as Organic Semiconductors," incorporated herein by reference. Other organic compositions can also be semiconductors, such as anthracene, tetracene, pentacene, and the like. Liquid crystal organic semiconductors are described further in published patent application 2006/0060840 to Hanna et al., entitled "Organic Semiconductor Structure, Manufacturing Method of the Same, and Organic Semiconductor Device," incorporated herein by reference. A further description of organic semiconductor processing is described in published U.S. patent 2007/0173578A to Spreitzer et al., entitled "Solutions of Organic Semiconductors," incorporated herein by reference. To the extent that the organic semiconducting polymers do not have properties appropriate to function as a binder for the inorganic particles, a further organic polymer can be included to bind the composite and serve as the organic matrix.

Ink Compositions and Formation of the Functional Dispersions and Inks

The functional dispersions can be formulated for a selected application. A functional dispersion can comprise inorganic particles, an organic matrix and a dispersion liquid. The inorganic particles may or may not be surface modified. The qualities of the dispersion can significantly affect the properties of the resulting composite. But some qualities of the composite can be difficult to quantify, although uniformity and other qualities can be inferred from the process to form the composite and some measurements can provide general information on the properties. In general, the term ink is used to describe a dispersion that is subsequently deposited using a printing technique, and an ink may or may not comprise additional additives to modify the ink properties.

In general, suitable dispersing liquids include, for example, liquid silanes, such as cyclopentasilane, C6-C16 hydrocarbons, C6-C16 halogenated hydrocarbons, C6-C16 alcohols, C6-C16 aldehydes, C6-C16 ketones, C6-C16 carboxylic acids, C6-C16 ethers, C6-C16 esters, C6-C16 amides, C6-C16 amines, C6-C16 imides, C6-C16 imines, C6-C16 nitrites, C6-C16 thiols, C6-C16 sulphoxides, C6-C16 sulphones, C6-C16 sulphides, corresponding C6-C16 compounds with combinations of these functional groups or a plurality of each functional group and mixtures thereof. In some embodiments, specific suitable dispersing liquids include, for example, cyclooctane, cyclohexane, cis-decahydronaphthalene and mixtures thereof. Suitable alcohols include, for example, small aliphatic alcohols, such as methanol, ethanol, propylene glycol, butanediol, mixtures thereof and the like. The dispersing liquid can be a blend of liquids.

In general, the functional inks comprise from about 0.001 to about 30 weight percent inorganic particles, in some embodiments from about 0.01 to about 25 weight percent particles, in additional embodiments from about 0.1 to about 23 weight percent and in further embodiments from about 1 to about 20 weight percent particles. In addition, the functional inks generally comprise from about 5 to about 99 weight percent matrix composition, such as semiconducting organic polymer, in other embodiments from about 6 to about 98 weight percent, and in additional embodiments from about 8 to about 95 weight percent matrix composition. Additionally, the functional inks generally comprise from about 1 to about 99 weight percent solvent, in other embodiments from about 3 to about 95 weight percent solvent and in further embodiments from about 5 to about 90 weight percent solvent. With respect to other processing aids, such as a dispersant or the like, the functional inks generally comprise no more than about 10 weight percent in some embodiments from about 0.01 to about 8 weight percent and in further embodiments from about 0.05 to about 6 weight percent. A person of ordinary skill in the art will recognize that additional ranges of concentrations within the explicit ranges above are contemplated and are within the present disclosure. The amount of dispersing liquid can be selected to achieve a desired viscosity for the ink based on the particular printing process used.

The dispersions can comprise additional compositions besides the inorganic particles, the organic matrix binder and the dispersing liquid to modify the properties of the dispersion to facilitate the particular application. For example, property modifiers can be added to the dispersion to facilitate the deposition process. Surfactants can be effectively added to the dispersion to influence the properties of the dispersion. Note that surfactants used to modify the dispersion properties, such as surface tension, may not associate with the particle surfaces such that these surfactants may not be particle surfactants that have an affinity for the inorganic particle surfaces.

In general, cationic, anionic, zwitter-ionic and nonionic surfactants can be helpful in particular applications for modifying dispersion properties. For these applications, the selection of the surfactant can be influenced by the particular dispersing liquid. In general, surfactants are known in the art. Furthermore, the surfactants can be selected to influence the wetting or beading of the dispersion/ink onto a substrate surface following deposition of the dispersion. In some applications, it may be desirable for the dispersion to wet the surface, while in other applications it may be desirable for the dispersion to bead on the surface. The surface tension on the particular surface can be influenced by the surfactant as well as the ligand selection. Also, blends of surfactants can be helpful to combine the desired features of different surfactants, such as improve the dispersion stability and obtaining desired wetting properties following deposition. In some embodiments, the dispersions can have surfactant concentrations from about 0.01 to about 5 weight percent, and in further embodiments from about 0.02 to about 3 weight percent.

The use of non-ionic surfactants in printer inks is described further in U.S. Pat. No. 6,821,329 to Choy, entitled "Ink Compositions and Methods of Ink-Jet Printing on Hydrophobic Media," incorporated herein by reference. Suitable non-ionic surfactants described in this reference include, for example, organo-silicone surfactants, such as SILWET™ surfactants from Crompton Corp., polyethylene oxides, alkyl polyethylene oxides, other polyethylene oxide derivatives, some of which are sold under the trade names, TERGITOL™, BRIJ™, TRITON™, PLURONIC™, PLURAFAC™, IGEPALE™, and SULFYNOL™ from commercial manufacturers Union Carbide Corp., ICI Group, Rhone-Poulenc Co., Rhom & Haas Co., BASF Group and Air Products Inc. Other nonionic surfactants include MACKAM™ octylamine chloroacetic adducts from McIntyre Group and FLUORAD™ fluorosurfactants from 3M. The use of cationic surfactants and anionic surfactants for printing inks is described in U.S. Pat. No. 6,793,724 to Satoh et al., entitled "Ink for Ink-Jet Recording and Color Ink Set," incorporated herein by reference. This patent describes examples of anionic surfactants such as polyoxyethylene alkyl ether sulfate salt and polyoxyalkyl ether phosphate salt, and examples of cationic surfactants, such as quaternary ammonium salts.

Viscosity modifiers can be added to alter the viscosity of the dispersions. Suitable viscosity modifiers include, for example soluble polymers, such as polyacrylic acid, polyvinyl pyrrolidone and polyvinyl alcohol. Other potential additives include, for example, pH adjusting agents, antioxidants, UV absorbers, antiseptic agents and the like. These additional additives are generally present in amounts of no more than about 5 weight percent. A person of ordinary skill in the art will recognize that additional ranges of surfactant and additive concentrations within the explicit ranges herein are contemplated and are within the present disclosure.

The viscosity of the dispersion/ink is dependent on the inorganic particle concentration and organic concentrations as well as the presence of other additives. Thus, there are several parameters that provide for adjustment of the viscosity. The viscosity is particularly relevant for inkjet printing although other printing and coating processes may have desired viscosity ranges. For some embodiments, the viscosity can be from 0.1 mPa·s to about 100 mPa·s and in further embodiments from about 0.5 mPa·s to about 25 mPa·s. For some embodiments, the dispersions/inks can have a surface tension from about 2.0 to about 6.0 N/m$^2$ and in further embodiments from about 2.2 to about 5.0 N/m$^2$ and in additional embodiments form about 2.5 to about 4.5 N/m$^2$. A person of ordinary skill in the art will recognize that additional ranges of viscosity and surface tension within the explicit ranges above are contemplated and are within the present disclosure.

The dispersions/inks can be formed using the application of appropriate mixing conditions. For example, mixers/blenders that apply shear can be used and/or sonication can be used to mix the dispersions. The particular additives can be added in an appropriate order to maintain the stability of the particle dispersion. In general, appropriately selected surfactants and some property modifiers can stabilize the dispersion. A person of ordinary skill in the art can select the additives and mixing conditions empirically based on the teachings herein.

Deposition and Curing

The dispersions/inks can be deposited for using a selected approach that achieves a desired distribution of the dispersion on a substrate. For example, coating and printing techniques can be used to apply the ink to a surface. Specifically, in some embodiments, the functional inks can be used for directly drawing or printing circuits and other functional structures, although other coating processes can be used in addition to or as an alternative to the printing approaches. Using selected printing approaches, patterns can be formed with relatively high resolution. Following deposition, the deposited material can be further processed into a desired device or state. In general, the functional inks can be printed or coated onto flexible substrates or rigid substrates depending on the particular application.

While, in general, a wide range of suitable substrates can be used, representative suitable substrates include, for example, ceramic sheets, such as glass sheets, flexible thin glass films, metal foils, such as stainless steel, copper, nickel or aluminum, and polymer films. For some applications, higher temperature polymer films can be used, such as films of polyimide, polyether sulfone, Kapton®, Kalrez®, norbornene-based polymers and the like. For example, see U.S. Pat. No. 6,492,443 to Kodemura et al., entitled "Norbornene Polymer Compositions," incorporated herein by reference.

FIG. 16 depicts a schematic diagram of a printed circuit in which one or more of the elements are formed from the curing of a functional ink printed onto a substrate. Circuit 100 comprises a substrate 102, devices 104, 106, 108, 110 and 112, and electrical interconnects 114, 116, 118, 120, 122, 124, 126. In some embodiments, each structure or a portion thereof can be formed with a selected functional ink specific for the functionality of the particular component.

Suitable coating approaches for the application of the dispersions include, for example, spin coatings, dip coating, spray coating, knife-edge coating, extrusion or the like. Coating approaches generally are used to cover a substrate, although a mask or the like can be used to limit the deposition locations following removal of the mask. In general, any suitable coating thickness can be applied, although in embodiments of particular interest, coating thickness can range from about 50 nm to about 500 microns and in further embodiments from about 100 nm to about 250 microns. A person of ordinary skill in the art will recognize that additional ranges of thicknesses within the particular ranges above are contemplated and are within the present disclosure.

Similarly, a range of printing techniques can be used to print the dispersion/ink into a pattern on a substrate. Suitable printing techniques include, for example, screen printing, inkjet printing, lithographic printing, gravure printing and the like. Suitable substrates include, for example, metal substrates, such as aluminum foil, nickel foil or copper foil, polymers, such as polysiloxanes, polyamides, polyimides, polyethylenes, polycarbonates, polyesters, combinations thereof, and the like, ceramic substrates, such as silica glass, and semiconductor substrates, such as silicon or germanium substrates. The composition of the substrates influences the appropriate range of processing options following deposition of the dispersion/ink.

While various coating and printing approaches are suitable, inkjet printing offers desirable features with respect to speed, resolution and versatility with respect to real time selection of deposition patterning while maintaining speed and resolution. Practical deposition using inkjet printing with inorganic particles requires dispersion properties that involve both the techniques to form high quality inorganic nanoparticle along with the improved ability to form high quality dispersions from these particles. Thus, the particles produced using laser pyrolysis combined with the improved surface modification approaches and dispersion techniques provides for the formation of inks that are amenable to inkjet deposition. Having small and uniform inorganic particles can be particularly advantageous for inkjet printing since larger particles may clog some inkjet heads. Inkjet resolution over large areas is presently readily available at 200 to 800 dpi. Also, inkjet resolution is continuing to improve. Inkjet heads can deliver different ink compositions to different substrate locations.

Curing generally is selected to be appropriate for the particular organic composition, e.g., polymer, and the curing process can involve more than one step. For example, in some embodiments, curing can be simply drying the ink. Drying to remove solvent and other volatile compounds, such as some processing additives, can be performed just by exposure to air, by reducing the pressure above the printed substrate, by heating the printed substrate at a modest temperature or by using a combination of these steps. Drying out the substrate using heat can be performed generally at temperatures no more than about 200° C., and in other embodiments from about 40° C. to about 150° C. A person of ordinary skill in the art will recognize that additional ranges of temperatures within the explicit ranges above are contemplated and are within the present disclosure.

In additional or alternative embodiments, curing can comprise heating the ink to higher temperatures to induce a chemical reaction in the matrix material, such as crosslinking of a polymer matrix. Heating generally is performed at a temperature at which other components of the structure are stable. Alternatively or additionally, the inks can be exposed to radiation to react the matrix material. For example, polymer matrix compositions can be exposed to ultraviolet radiation, electron beam radiation, corona radiation to crosslink the polymer.

In some embodiments, the processing steps for producing a functional film comprising inorganic particles, such as elemental metal/metalloid particles, in a polymer matrix comprise moving a substrate sequentially through a plurality of processing stations. At least one of the processing stations performs printing with a functional ink at select locations using an appropriate printing process, such as inkjet printing. At a second processing station, heat, radiation and or a vacuum are applied to cure the printed functional ink into a solid material comprising a composite material.

Applications

Inks described herein can be used to print selected functional composites for incorporation and/or further processing into a range of devices. The inks deliver inorganic particle-organic matrix composites with functional materials to selected positions within the overall structure. While the deposited composites can be used to form structural features and the like, the composites can be especially useful for the formation, for example, of electronic and optical-electronic components, display components and biochip components and corresponding products. The ability to directly print circuits and other structures provides for significant saving in material cost as well as reducing waste of valuable resources. Potential applications of the composites in printed electronics, such as for components of flexible circuitry or for elements of the components, in which suitable components include, for example, capacitors, resistors, conductors, inductors, interconnects, semiconductors, RFID antennas, smart cards, e-paper, thin film transistors, solar cell components, battery components, memory devices, such as SRAM, CPUs and the like. The functional composites can replace conventional semiconducting, conducting or other functional material.

In some embodiments, the composites can be used to form one or more structures within a display, which can be a flexible display and which can have a small area or a large area. For example, Aveso, Inc. is marketing smart credit cards with small printed displays. This technology is described further, for example, in published PCT Application WO 2006/110616A to Pennaz et al., entitled "Layered Structure With Printed Elements," incorporated herein by reference.

Thin film transistors (TFTs) can be used to gate new display structures including, for example, active matrix liquid crystal displays, electrophoretic displays, and organic light emitting diode displays (OLED). Appropriate elements of the transistors can be formed functional composites printed using conventional photolithographic approaches or for moderate resolution using inkjet printing or other suitable printing techniques. The substrates can be selected to be compatible with the cure temperatures, if a thermal cure is performed.

The TFTs comprise doped semiconductor elements and corresponding interfaces. Thin film transistors used as electronic gates for a range of active matrix displays are described further in Published U.S. Patent Application number 2003/0222315A to Amundson et al., entitled "Backplanes for Display Applications, and Components for use Therein," incorporated herein by reference. An n-type doped polycrystalline or amorphous silicon TFT active element with an anode common structure with an organic LED element is described further in U.S. Pat. No. 6,727,645 to Tsjimura et al., entitled "Organic LED Device," incorporated herein by reference. Conventional photolithography techniques for the formation of TFTs is described further in U.S. Pat. No. 6,759,711 to Powell, entitled "Method of Manufacturing a Transistor," incorporated herein by reference.

Electrophoretic displays are described further, for example, in U.S. Pat. No. 7,116,466 to Whitesides et al., entitled "Electro-Optic Displays," incorporated herein by reference. OLED display structures are described further, for example, in U.S. Pat. No. 6,727,645 to Tsujimura et al., entitled "Organic LED Device," and published U.S. Patent Application 2003/0190763 to Cok et al., entitled "Method of Manufacturing a Top-Emitting OLED Display Device With Desiccant Structures," both of which are incorporated herein by reference. U.S. Pat. No. 6,759,711 further describes integration of TFTs with an active matrix liquid crystal display. The inks described herein can be effectively used to print elements comprising the functional composites as elements of a TFT.

Biochips are growing in use for diagnostic medical purposes. U.S. Pat. No. 6,761,816 to Blackburn et al., entitled "Printed Circuit Boards With Monolayers and Capture Ligands," incorporated herein by reference. These biochip arrays have electrical circuits integrated with biological components so that automatic evaluations can be performed. The inks described herein can be used to form electrical components from the functional composites for these devices while biological liquids can be printed or otherwise deposited for the other components.

Radio-Frequency Identification (RFID) tags are gaining widespread use for loss prevention. These devices are desired to be small for less obtrusiveness and low cost. The functional inks described herein can be used effectively to print RFIDs or components thereof. Systems for printing RFIDs on a roll-to-roll configuration are described further in published U.S. Patent Application serial number 2006/0267776A to Taki et al., entitled "RFID-Tag Fabricating Apparatus and Cartridge," incorporated herein by reference.

The formation of a solar cell components with polysilane as a functional ink is described in Published U.S. Patent Application 2003/0045632A to Shiho et al., entitled "Silane Composition, Silicon Film Forming Method and Solar Cell Production Method," incorporated herein by reference. Solar cells with rear contacts and electrical interconnects along the rear surface of a silicon foil are described further in copending provisional patent application 60/902,006 to Hieslmair, filed on Feb. 16, 2007, entitled "Photovoltaic Cell Structures, Solar Panels and Corresponding Processes," incorporated herein by reference. The functional composites deposited using corresponding inks described herein can be effective to form additional components for the solar cell through printing. For example, the functional inks described herein can be used effectively to deliver dopants for the formation of cell contacts as well as with other composites for forming interconnects.

The embodiments above are intended to be illustrative and not limiting. Additional embodiments are within the claims. In addition, although the present invention has been described with reference to particular embodiments, those skilled in the art will recognize that changes can be made in form and detail without departing from the spirit and scope of the invention. Any incorporation by reference of documents above is limited such that no subject matter is incorporated that is contrary to the explicit disclosure herein.

What is claimed is:

1. A composite material comprising inorganic particles and an organic binder, the particles having an average primary particle size of no more than about 50 nm and a dispersed secondary particle size of no more than about 250 nm when incorporated into the composite wherein the inorganic particles comprise elemental metal, elemental metalloid, alloy thereof or combination thereof, wherein the organic binder comprises an organic semiconducting polymer, and wherein the composite comprises from about 15 to about 80 weight percent particles.

2. The composite material of claim 1 wherein the inorganic particles have a distribution of primary particle sizes such that at least about 95 percent of the primary particles have a particle size greater than about 40 percent of the average particle size and less than about 250 percent of the average particle size.

3. The composite material of claim 1 wherein the composite comprises at least about 50 weight percent particles.

4. The composite material of claim 1 wherein the particles comprise a dopant.

5. The composite material of claim 1 wherein the organic semiconducting polymer comprises aromatic groups and wherein the particles have a surface modifying compound having an aromatic moiety.

6. The composite material of claim 1 wherein the organic semiconducting polymer is selected from the group consisting of a poly(phenylene vinylene), a polypyrrole, a polyisothianaphene, a poly(paraphenylene), a polyphenylene, a polythiophene, a polyvinylthiophene, a polynaphthalene derivative, a polyaniline, a polyperfluorine, a polyspirobisfluorine, a polypyridine, a polypyrrol, copolymers thereof and mixtures thereof.

7. The composite material of claim 1 wherein a linker moiety is associated with the particle surface and is covalently bonded with the organic semiconducting polymer.

8. The composite material of claim 1 wherein the inorganic particles comprise elemental silicon.

9. The composite material of claim 1 wherein the particles have a surface modifying compound having an organic aromatic functional group that comprises aromatic carbon rings.

10. The composite material of claim 1 wherein the particles have a surface modifying compound having an organic aromatic functional group that comprises at least one heteroatom and at least one carbon within the aromatic ring.

11. The composite material of claim 1 wherein the particles have a surface modification moiety that is chemically bonded to the inorganic particles.

12. The composite material of claim 1 wherein a surface modification moiety functions as a surface active agent for the inorganic particle surfaces without a chemical bonding interaction.

13. A composite material comprising inorganic particles and an organic semiconducting binder, the particles having an average primary particle size of no more than about 250 nm and a dispersed secondary particle size of no more than about 2 microns when incorporated into the composite wherein the inorganic particles comprise a metal oxide, a metalloid oxide, a combination thereof, or a mixture thereof and wherein the particles within the composite are substantially non-agglomerated.

14. The composite material of claim 13 wherein the particles have a surface modification moiety that is covalently bonded to the organic semiconducting binder.

15. A composite material comprising inorganic particles and an organic binder, the particles having an average primary particle size of no more than about 50 nm and a dispersed secondary particle size of no more than about 250 nm when incorporated into the composite wherein the inorganic particles comprise doped elemental silicon.

16. The composite material of claim 15 wherein the inorganic particles have a distribution of primary particle sizes such that at least about 95 percent of the primary particles have a particle size greater than about 40 percent of the average particle size and less than about 250 percent of the average particle size.

17. The composite material of claim 15 wherein the organic binder comprises an organic semiconducting polymer selected from the group consisting of a poly(phenylene vinylene), a polypyrrole, a polyisothianaphene, a poly(paraphenylene), a polyphenylene, a polythiophene, a polyvinylthiophene, a polynaphthalene derivative, a polyaniline, a polyperfluorine, a polyspirobisfluorine, a polypyridine, a polypyrrol, copolymers thereof and mixtures thereof.

18. The composite material of claim 15 wherein a linker moiety is associated with the particle surface and is covalently bonded with the organic binder.

* * * * *